(12) United States Patent
Yamazaki

(10) Patent No.: US 12,176,371 B2
(45) Date of Patent: Dec. 24, 2024

(54) CURRENT ASSISTED PHOTONIC DEMODULATOR (CAPD) INDIRECT TIME OF FLIGHT (TOF) LIGHT-RECEIVING ELEMENT

(71) Applicant: SONY SEMICONDUCTOR SOLUTIONS CORPORATION, Kanagawa (JP)

(72) Inventor: Takeshi Yamazaki, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 580 days.

(21) Appl. No.: 17/421,472

(22) PCT Filed: Jan. 8, 2020

(86) PCT No.: PCT/JP2020/000355
§ 371 (c)(1),
(2) Date: Jul. 8, 2021

(87) PCT Pub. No.: WO2020/158322
PCT Pub. Date: Aug. 6, 2020

(65) Prior Publication Data
US 2022/0068983 A1 Mar. 3, 2022

(30) Foreign Application Priority Data
Feb. 1, 2019 (JP) .................................. 2019-017235

(51) Int. Cl.
*H01L 27/146* (2006.01)
*G01B 11/22* (2006.01)
(Continued)

(52) U.S. Cl.
CPC .......... *H01L 27/1463* (2013.01); *G01B 11/22* (2013.01); *G01S 7/4816* (2013.01);
(Continued)

(58) Field of Classification Search
CPC .......... H01L 27/14629; H01L 27/14641; H01L 27/14627; H01L 31/103; H01L 27/1463;
(Continued)

(56) References Cited

U.S. PATENT DOCUMENTS

2014/0139817 A1 5/2014 Yamada
2014/0160335 A1* 6/2014 Shimotsusa ............ H04N 25/75
438/69
(Continued)

FOREIGN PATENT DOCUMENTS

EP 3193369 A1 7/2017
EP 3573104 A1 11/2019
(Continued)

OTHER PUBLICATIONS

International Search Report prepared by the Japan Patent Office on Mar. 12, 2020, for International Application No. PCT/JP2020/000355.

*Primary Examiner* — Jennifer D Bennett
(74) *Attorney, Agent, or Firm* — Sheridan Ross PC

(57) ABSTRACT

Distance measurement accuracy is improved. A light-receiving element according to an embodiment includes a semiconductor substrate, and lattice-shaped pixel separating parts that divide the semiconductor substrate into a plurality of pixel regions arranged in a matrix form, wherein each of the pixel regions includes: a first semiconductor region disposed on a first surface side in the semiconductor substrate; a second semiconductor region disposed on the first surface side in the semiconductor substrate separately from the first semiconductor region; and a first blocking region disposed between the first semiconductor region and the second semiconductor region on the first surface side in the semiconductor substrate and having a dielectric constant different from that of the semiconductor substrate.

20 Claims, 43 Drawing Sheets

(51) Int. Cl.
*G01S 7/481* (2006.01)
*G01S 17/46* (2006.01)
*G01S 17/89* (2020.01)
*G01S 17/931* (2020.01)

(52) U.S. Cl.
CPC .............. *G01S 17/46* (2013.01); *G01S 17/89* (2013.01); *G01S 17/931* (2020.01); *H01L 27/14605* (2013.01); *H01L 27/14623* (2013.01); *H01L 27/1464* (2013.01); *H01L 27/1461* (2013.01); *H01L 27/14629* (2013.01); *H01L 27/14641* (2013.01)

(58) Field of Classification Search
CPC ......... H01L 27/14605; H01L 27/14623; H01L 27/1464; H01L 27/1461; G01B 11/12; G01S 7/4816; G01S 17/46; G01S 17/89; G01S 17/931; G01S 17/894; G01S 17/08; H04N 25/75
See application file for complete search history.

(56) References Cited

U.S. PATENT DOCUMENTS

| | | | |
|---|---|---|---|
| 2014/0246707 A1* | 9/2014 | Koo | .................. H01L 27/14689 |
| | | | 257/230 |
| 2015/0015768 A1* | 1/2015 | Tanaka | .............. H01L 27/14621 |
| | | | 348/342 |
| 2017/0287955 A1 | 10/2017 | Ukigaya et al. | |
| 2018/0350856 A1 | 12/2018 | Masagaki | |
| 2019/0019821 A1 | 1/2019 | Fotopoulou et al. | |
| 2019/0342510 A1 | 11/2019 | Sano | |
| 2020/0057151 A1* | 2/2020 | Finkelstein | ............ G01S 7/4876 |
| 2020/0135776 A1* | 4/2020 | Finkelstein | ......... H01L 31/0232 |

FOREIGN PATENT DOCUMENTS

| | | |
|---|---|---|
| JP | 2011-086904 | 4/2011 |
| JP | 2014-123714 | 7/2014 |
| JP | 2017-183661 | 10/2017 |
| JP | 2018-117117 | 7/2018 |
| KR | 20180103124 A | 9/2018 |
| TW | 201635502 A | 10/2016 |
| WO | WO-2017121785 A1 | 7/2017 |
| WO | WO-2018135320 A1 | 7/2018 |

\* cited by examiner

CURRENT ASSISTED PHOTONIC DEMODULATOR (CAPD) INDIRECT TIME OF FLIGHT (TOF) LIGHT-RECEIVING ELEMENT

CROSS REFERENCE TO RELATED APPLICATIONS

This application is a national stage application under 35 U.S.C. 371 and claims the benefit of PCT Application No. PCT/JP2020/000355 having an international filing date of 8 Jan. 2020, which designated the United States, which PCT application claimed the benefit of Japanese Patent Application No. 2019-017235 filed 1 Feb. 2019, the entire disclosures of each of which are incorporated herein by reference.

TECHNICAL FIELD

The present disclosure relates to a light-receiving element, a solid-state imaging device, and a distance measurement device.

BACKGROUND ART

Conventionally, a distance measurement sensor using an indirect ToF (Time of Flight) method is known. In this distance measurement sensor, a distance to an object is measured on the basis of signal charges obtained by projecting light from a light source with a certain phase and receiving reflected light thereof.

In such a distance measurement sensor using the indirect ToF method (hereinafter referred to as an indirect ToF sensor), a sensor capable of rapidly distributing signal charges of reflected light to different regions is essential. Accordingly, Patent Literature 1 below discloses a technology for rapidly modulating a region of a wide range in a substrate of a sensor by directly applying a voltage to the substrate of the sensor to generate current in the substrate, for example. This sensor is also called a current assisted photonic demodulator (CAPD) type indirect ToF sensor.

CITATION LIST

Patent Literature

PTL 1

Japanese Patent Application Publication No. 2011-86904

SUMMARY

Technical Problem

However, the CAPD type indirect ToF sensor according to the conventional technology has problems that pixels are not sufficiently separated and thus light reflected in a certain pixel leaks into adjacent pixels to generate color mixing, leading to deterioration of distance measurement accuracy.

Accordingly, the present disclosure proposes a light-receiving element, a solid-state imaging device, and a distance measurement device capable of improving distance measurement accuracy.

Solution to Problem

To solve the aforementioned problems, a light-receiving element according to one aspect of the present disclosure includes a semiconductor substrate and lattice-shaped pixel separating parts that divide the semiconductor substrate into a plurality of pixel regions arranged in a matrix form, wherein each of the pixel regions includes a first semiconductor region disposed on a first surface side in the semiconductor substrate, a second semiconductor region disposed on the first surface side in the semiconductor substrate separately from the first semiconductor region, and a first blocking region disposed between the first semiconductor region and the second semiconductor region on the first surface side in the semiconductor substrate and having a dielectric constant different from that of the semiconductor substrate.

DESCRIPTION OF EMBODIMENTS

Figure 1:
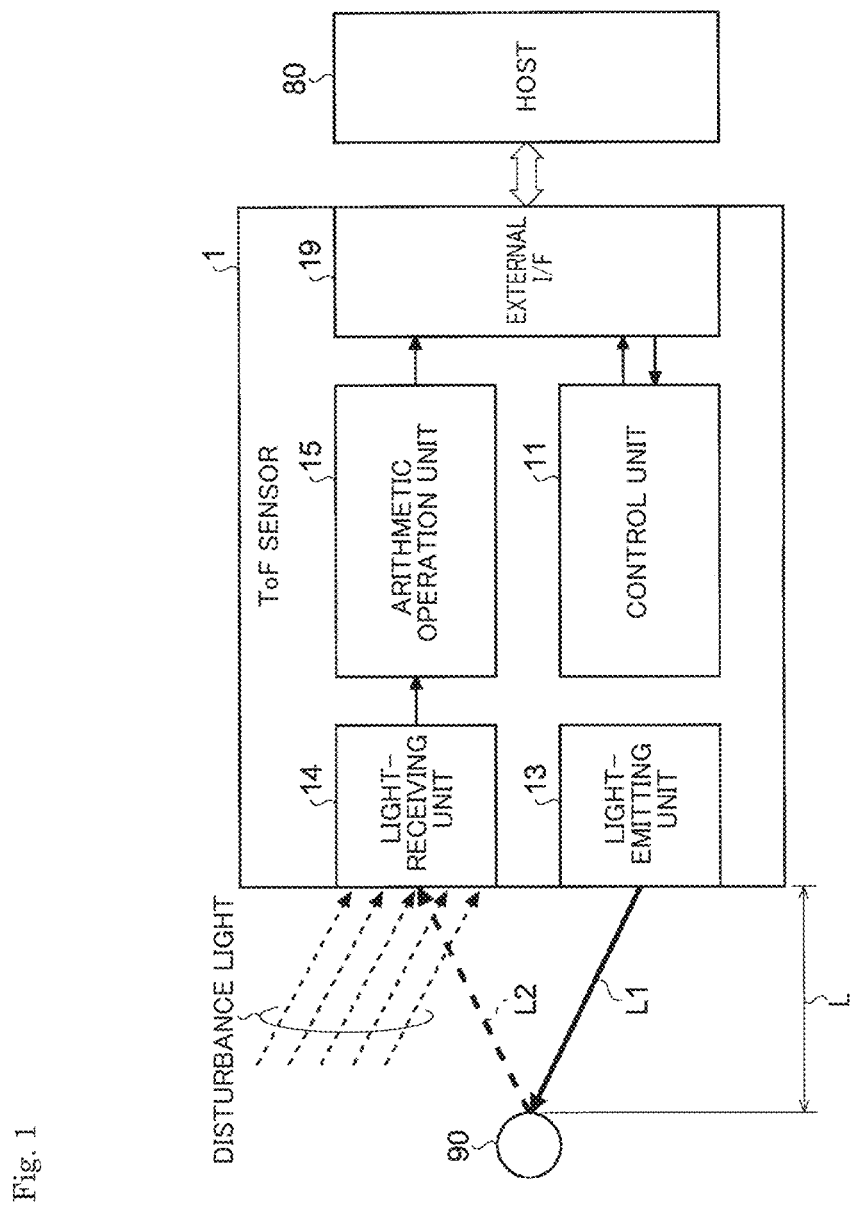
FIG. 1 is a block diagram illustrating a schematic configuration example of a ToF sensor as a distance measurement device according to a first embodiment.

Hereinafter, an embodiment of the present disclosure will be described in detail with reference to the drawings. Further, the same parts in the following embodiments are denoted by the same reference numerals to omit redundant description.

In addition, the present disclosure will be described in the following order of items.

1. First embodiment
1.1 Distance measurement device (ToF sensor)
1.2 Configuration example of solid-state imaging device
1.3 Example of circuit configuration of unit pixel
1.4 Example of read operation of unit pixel
1.5 Chip configuration example
1.6 Example of planar layout of light-receiving elements
1.7 Optical separation between light-receiving elements
1.8 Example of cross-sectional structure of unit pixel
1.9 Operation and effects
1.10 Modified examples of pixel separating parts
1.10.1 First modified example
1.10.2 Second modified example
2. Second embodiment
2.1 Example of planar layout of light-receiving elements
2.2 Example of planar layout of pixel separating parts
2.2.1 First example
2.2.2 Second example
2.2.3 Third example
2.3 Operation and effects
3. Third embodiment
3.1 Example of planar layout of light-receiving elements
3.2 Example of planar layout of pixel separating parts
3.2.1 First example
3.2.2 Second example
3.3 Operation and effects
4. Fourth embodiment
5. Fifth embodiment
5.1 Configuration example of light-receiving element
5.2 Operation and effects
5.3 Modified examples of blocking region
5.3.1 First modified example
5.3.2 Second modified example
5.3.3 Third modified example
5.3.4 Fourth modified example
5.3.5 Fifth modified example
6. Sixth embodiment
6.1 First example
6.2 Second example
6.3 Third example
6.4 Fourth example
6.5 Operation and effects
7. Seventh embodiment
8. Application examples 1. First Embodiment First, a first embodiment will be described in detail with reference to the following drawings. Further, in the first embodiment, a light-receiving element that measures a distance to an object using the indirect ToF method, a solid-state imaging device, and a distance measurement device will be described, for example.

The light-receiving element, the solid-state imaging device, and the distance measurement device according to the present embodiment can be applied to an on-board system that is mounted in a vehicle and measures a distance to a target outside the vehicle, a gesture recognition system that measures a distance to a target such as a hand of a user and recognizes a gesture of the user on the basis of a measurement result, and the like, for example. In this case, gesture recognition results can also be used, for example, for operation of a car navigation system, and the like.

1.1 Distance Measurement Device (ToF Sensor)

FIG. 1 is a block diagram illustrating a schematic configuration example of a ToF sensor as the distance measurement device according to the present embodiment. As illustrated in FIG. 1, the ToF sensor 1 includes a control unit 11, a light-emitting unit 13, a light-receiving unit 14, an arithmetic operation unit 15, and an external interface (I/F) 19.

The control unit 11 includes an information processing device such as a central processing unit (CPU), for example, and controls each component of the ToF sensor 1.

The external I/F 19 may be a communication adapter for establishing communication with an external host 80 through a communication network based on an arbitrary standard such as a controller area network (CAN), a local interconnect network (LIN), and FlexRay (registered trademark) in addition to a wireless local area network (LAN) and a wired LAN.

Here, the host 80 may be an engine control unit (ECU) mounted in a car and the like, for example, when the ToF sensor 1 is provided in the car and the like. In addition, when the ToF sensor 1 is mounted in an autonomous moving robot such as a household pet robot, and an autonomous moving body such as a robot cleaner, an unmanned aerial vehicle, or a tracking transportation robot, the host 80 may be a control device or the like which controls the autonomous moving body.

The light-emitting unit 13 includes, for example, one or more semiconductor laser diodes as a light source and projects laser light L1 in a pulse form with a predetermined duration in a predetermined period (also referred to as an emission period). The light-emitting unit 13 projects the laser light L1 toward at least an angle range equal to or greater than an angle of view of the light-receiving unit 14. In addition, the light-emitting unit 13 projects the laser light L1 with a duration of 10 ns (nanoseconds) in a period of 100 MHz (megahertz), for example. When an object 90 is present within a distance measurement range, for example, the laser light L1 projected from the light-emitting unit 13 is reflected by the object 90 and is incident on the light-receiving unit 14 as reflected light L2.

Although details of the light-receiving unit 14 will be described later, the light-receiving unit 14 includes, for example, a plurality of pixels arranged in a two-dimensional lattice form and outputs a signal strength (hereinafter referred to as a pixel signal) detected through each pixel after emission of light from the light-emitting unit 13.

The arithmetic operation unit 15 generates a depth image within the angle of view of the light-receiving unit 14 on the basis of pixel signals output from the light-receiving unit 14. Here, the arithmetic operation unit 15 may execute predetermined processing such as noise removal on the generated depth image. The depth image generated by the arithmetic operation unit 15 may be output to the host 80 through the external I/F 19, for example.

1.2. Configuration Example of Solid-State Imaging Device

Figure 2:
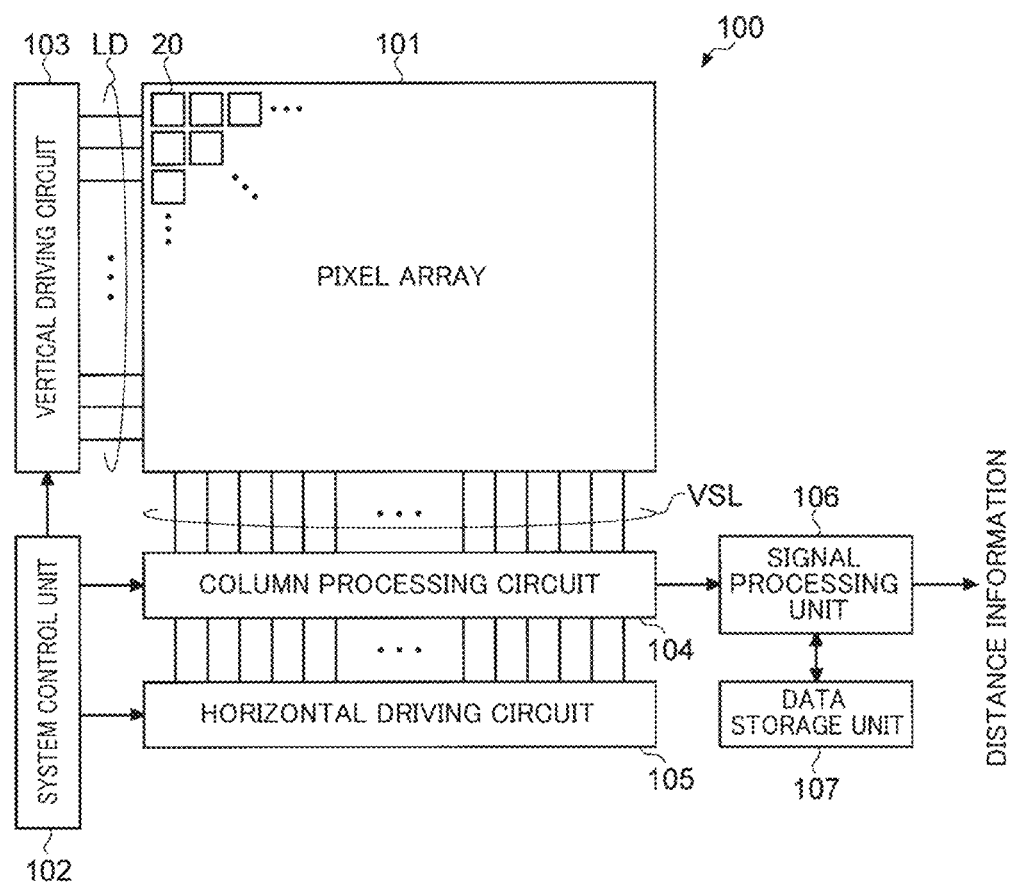
FIG. 2 is a block diagram illustrating a schematic configuration example of a solid-state imaging device as a light-receiving unit according to the first embodiment.

FIG. 2 is a block diagram illustrating a schematic configuration example of a solid-state imaging device as the light-receiving unit according to the first embodiment.

The solid-state imaging device 100 illustrated in FIG. 2 is provided in a distance measurement device that is a back side radiation type CAPD indirect ToF sensor (hereinafter simply referred to as a CAPD sensor) and has a distance measurement function.

The solid-state imaging device 100 includes a pixel array unit 101 and peripheral circuits. The peripheral circuits may include, for example, a vertical driving circuit 103, a column processing circuit 104, a horizontal driving circuit 105, and a system control unit 102.

The solid-state imaging device 100 may further include a signal processing unit 106 and a data storage unit 107. Further, the signal processing unit 106 and the data storage unit 107 may be mounted on the same substrate as that of the solid-state imaging device 100 or mounted on a substrate different from that of the solid-state imaging device 100 in a distance measurement device.

The pixel array unit 101 includes a configuration in which pixels (hereinafter referred to as unit pixels) 20 that generate charges in response to the amount of received light and output signals in response to the charges are arranged in a row direction and a column direction, that is, in a two-dimensional lattice form. That is, the pixel array unit 101 includes a plurality of unit pixels 20 that perform photoelectric conversion on incident light and output signals in response to charges obtained as photoelectric conversion results.

Here, the row direction refers to an arrangement direction (horizontal direction in the figure) of unit pixels 20 in a pixel row and the column direction refers to an arrangement direction (vertical direction in the figure) of unit pixels 20 in a pixel column.

In the pixel array unit 101, a pixel driving line LD is wired in the row direction for each pixel row and two vertical signal lines VSL are wired in each pixel column in the column direction in the pixel arrangement in the matrix form. For example, the pixel driving line LD transmits a driving signal for performing driving when signals are read from unit pixels 20. Further, although the pixel driving line LD is illustrated as one wire in FIG. 2, it is not limited to one wire. In addition, one end of the pixel driving line LD is connected to an output terminal corresponding to each row of the vertical driving circuit 103.

The vertical driving circuit 103 includes a shift register, an address decoder, and the like, and drives each unit pixel 20 of the pixel array unit 101 simultaneously for all pixels or in units of row or the like. That is, the vertical driving circuit 103 constitutes a driving unit that controls the operation of each unit pixel 20 of the pixel array unit 101 along with the system control unit 102 that controls the vertical driving circuit 103.

Further, in distance measurement using the indirect ToF method, the number of elements (CAPD elements) that are rapidly driven and connected to one control line affects the controllability of rapid driving and the accuracy of driving. Solid-state imaging elements used for distance measurement using the indirect ToF method include a horizontally long pixel array unit in many cases. Accordingly, in such a case, the vertical signal lines VSL and other vertically long control lines may be used with respect to control lines of elements that are rapidly driven. In this case, a plurality of unit pixels 20 arranged in the vertical direction are connected to the vertical signal lines VSL and other vertically long control lines, for example, and the unit pixels 20, that is, the solid-state imaging device 100 are driven by a driving unit, the horizontal driving circuit 105, and the like which are provided separately from the vertical driving circuit 103 through the vertical signal lines VSL and the other control lines.

A signal output from each unit pixel 20 of pixel rows according to driving control of the vertical driving circuit 103 is input to the column processing circuit 104 through the vertical signal lines VSL. The column processing circuit 104 performs predetermined signal processing on the signal output from each unit pixel 20 through the vertical signal lines VSL and temporarily holds the pixel signal after the signal processing.

Specifically, the column processing circuit 104 performs noise removal, analog-to-digital (AD) conversion, and the like as signal processing.

The horizontal driving circuit 105 includes a shift register, an address decoder, and the like and sequentially selects unit circuits corresponding to pixel columns of the column processing circuit 104. By this selective scanning performed by the horizontal driving circuit 105, pixel signals processed by the column processing circuit 104 for respective unit circuits are sequentially output.

The system control unit 102 includes a timing generator for generating various timing signals, and the like and performs drive control of the vertical driving circuit 103, the column processing circuit 104, the horizontal driving circuit 105, and the like on the basis of various timing signals generated by the timing generator.

The signal processing unit 106 has at least an arithmetic operation processing function, executes various types of signal processing such as arithmetic operation processing on the basis of pixel signals output from the column processing circuit 104, and outputs distance information for each pixel calculated through signal processing to the outside. The data storage unit 107 temporarily stores data necessary for the signal processing in the signal processing unit 106.

1.3 Example of Circuit Configuration of Unit Pixel

Figure 3:
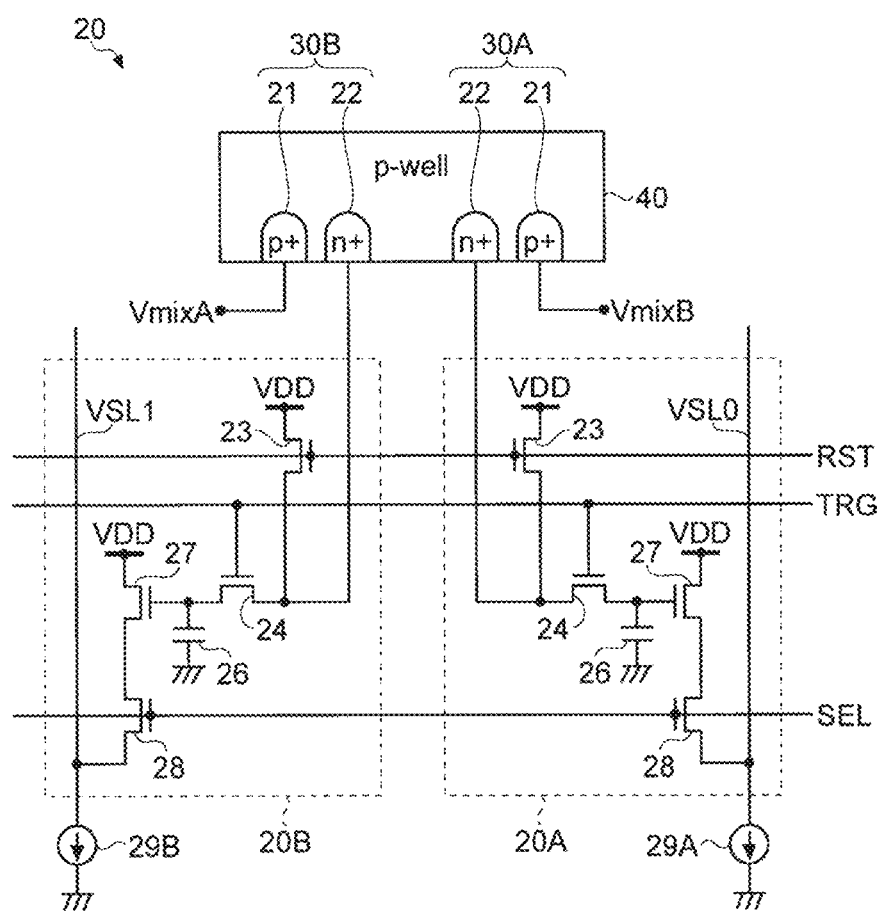
FIG. 3 is a circuit diagram illustrating an example of an equivalent circuit of a unit pixel according to the first embodiment.

FIG. 3 is a circuit diagram illustrating an example of an equivalent circuit of a unit pixel according to the present embodiment. As illustrated in FIG. 3, the unit pixel 20 has a configuration in which a voltage for charge read (hereinafter referred to as a read voltage) VmixA is applied to a p+ semiconductor region (hereinafter referred to as MIX) 21 in one signal extraction part 30A of two signal extraction parts 30A and 30B formed in a semiconductor substrate 40, and a read circuit 20A including a transfer transistor 24, an FD 26, a reset transistor 23, an amplification transistor 27, and a select transistor 28 is connected to an n+ semiconductor region (hereinafter referred to as DET) 22.

Likewise, the unit pixel 20 has a configuration in which a read voltage VmixB is applied to the MIX 21 in the other signal extraction part 30B, and a read circuit 20B including the transfer transistor 24, the FD 26, the reset transistor 23, the amplification transistor 27, and the select transistor 28 is connected to the DET 22.

Further, the two signal extraction parts 30A and 30B in the semiconductor substrate 40 are PN semiconductor regions including the MIX 21 and the DET 22, and the regions including these two signal extraction parts 30A and 30B serve as light-receiving elements of each unit pixel 20.

The vertical driving circuit 103 applies the read voltage VmixA to the MIX 21 of the signal extraction part 30A and applies the read voltage VmixB to the MIX 21 of the signal extraction part 30B. For example, when a signal (charges) is extracted from the signal extraction part 30A, the vertical driving circuit 103 applies a read voltage VmixA of 1.5 V (volts) to the MIX 21 of the signal extraction part 30A and applies a read voltage VmixB of 0 V to the MIX 21 of the signal extraction part 30B. On the other hand, when a signal (charge) is extracted from the signal extraction part 30B the vertical driving circuit 103 applies a read voltage VmixB of 1.5 V (volts) to the MIX 21 of the signal extraction part 30B and applies a read voltage VmixA of 0 V to the MIX 21 of the signal extraction part 30A.

DET 22 in each of the signal extraction parts 30A and 30B is a charge detection part that detects and accumulates charges generated according to photoelectric conversion of light incident on the semiconductor substrate 40.

In each of the read circuits 20A and 20B, the transfer transistor 24 transfers charges accumulated in the DET 22 corresponding thereto to the FD 26 by switching to a conductive state in response to an active state of a driving signal TRG supplied to the gate thereof from the vertical driving circuit 103.

The FD 26 has a charge voltage conversion function of generating a voltage having a voltage value corresponding to accumulated charges and, by temporarily holding charges transferred from the DET 22, applies a voltage having a voltage value corresponding to the amount of charges to the gate of the amplification transistor 27.

The reset transistor 23 resets an electric potential of the FD 26 to a predetermined level (reset level VDD) by switching to a conductive state in response to an active state of a driving signal RST supplied to the gate thereof from the vertical driving circuit 103. Further, the transfer transistor 24 may also switch to an active state when the reset transistor 23 switches to an active state to reset charges accumulated in the DET 22 as well.

The amplification transistor 27 is connected to a vertical signal line VSL0/VSL1 through the source thereof via the select transistor 28 to constitute a source follower circuit along with a load MOS transistor of a constant current circuit 29A/29B connected to one end of the vertical signal line VSL0/VSL1.

The select transistor 28 is connected between the source of the amplification transistor 27 and the vertical signal line VSL0/VSL1. The select transistor 28 switches to a conductive state in response to an active state of a select signal SEL supplied to the gate thereof from the vertical driving circuit 103 and outputs a pixel signal output from the amplification transistor 27 to the vertical signal line VSL0/VSL1.

1.4 Example of Read Operation of Unit Pixel

Subsequently, a read operation when a distance to a target is measured according to the indirect ToF method using the solid-state imaging device 100 having the above-described structure will be described in detail with reference to FIG. 3 and the like.

When a distance to a target is measured according to the indirect ToF method, light with a specific wavelength (e.g., infrared light) is projected from the light-emitting unit 13 (refer to FIG. 1) to the target. Then, when the light is reflected by the target and is incident on the light-receiving unit 14 as reflected light, the semiconductor substrate 40 of the solid-state imaging device 100 performs photoelectric conversion on the incident reflected light to generate charge corresponding to the amount of light.

Here, the vertical driving circuit 103 drives the unit pixels 20 and distributes signals corresponding to the charge acquired by the photoelectric conversion to the FD 26 of the two read circuits 20A and 20B.

For example, the vertical driving circuit 103 applies a voltage to two MIXs 21 in the same unit pixel 20 at a certain timing. Specifically, the vertical driving circuit 103 applies a read voltage VmixA of 1.5 V (volts) to the MIX 21 of the signal extraction part 30A and applies a read voltage VmixB of 0 V to the MIX 21 of the signal extraction part 30B, for example.

In this state, when light is incident into the semiconductor substrate 40 through an on-chip lens 45 and charges are generated according to photoelectric conversion of the light, these generated charges are induced to move to the MIX 21 of the signal extraction part 30A and gather in the DET 22 of this signal extraction part 30A.

In this case, the charges (i.e., electrons) generated through photoelectric conversion are used as signal carriers for detecting the amount of light incident on a light-receiving element 31, that is, a signal corresponding to the amount of received light.

The charges gathering in the DET 22 of the signal extraction part 30A are transferred to the FD 26 through the transfer transistor 24 of the read circuit 20A. Accordingly, a voltage having a voltage value corresponding to the charges accumulated in the FD 26 is applied to the gate of the amplification transistor 27 in the read circuit 20A, and as a result, the voltage having the voltage value corresponding to the amount of charges accumulated in the FD 26 appears on the vertical signal line VSL0 through the select transistor 28.

The voltage appearing on the vertical signal line VSL0 is read as a digital pixel signal by the column processing circuit 104 and input to the signal processing unit 106.

In addition, a voltage is applied to the two MIXs 21 of the light-receiving element 31 at the next timing such that an electric field in a direction opposite the direction of an electric field generated up to this point in time in the light-receiving element 31 is generated. Specifically, the vertical driving circuit 103 applies a read voltage VmixB of 1.5 V (volts) to the MIX 21 of the signal extraction part 30B and applies a read voltage VmixA of 0 V to the MIX 21 of the signal extraction part 30B, for example.

In this state, when light is incident into the semiconductor substrate 40 through an on-chip lens 45 and charges are generated according to photoelectric conversion of the light, these generated charges are induced to move to the MIX 21 of the signal extraction part 30B and gather in the DET 22 of this signal extraction part 30B. Further, the signal carriers may be electronics as described above.

The charges gathering in the DET 22 of the signal extraction part 30B are transferred to the FD 26 through the transfer transistor 24 of the read circuit 20B. Accordingly, a voltage having a voltage value corresponding to the charge accumulated in the FD 26 is applied to the gate of the amplification transistor 27 in the read circuit 20B, and as a result, the voltage having the voltage value corresponding to the amount of charge accumulated in the FD 26 appears on the vertical signal line VSL1 through the select transistor 28.

The voltage appearing on the vertical signal line VSL1 is read as a digital pixel signal by the column processing circuit 104 and input to the signal processing unit 106.

For example, the signal processing unit 106 calculates distance information representing a distance to the target on the basis of a difference between the pixel signals read by the two read circuits 20A and 20B and outputs the calculated distance information to the outside.

As described above, a method of distributing the two signal extraction parts 30A and 30B and signal carriers and calculating the distance information on the basis of the pixel signals read by the read circuits 20A and 20B is referred to as the indirect ToF method.

1.5 Chip Configuration Example

Figure 4:
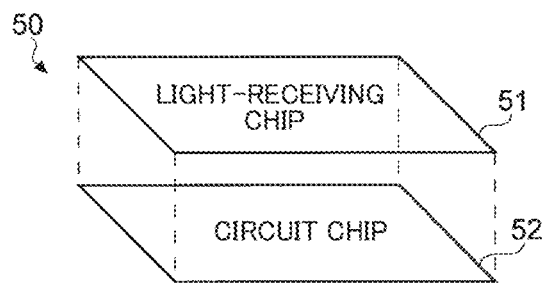
FIG. 4 is a diagram illustrating an example of a chip configuration of the solid-state imaging device according to the first embodiment.

FIG. 4 is a diagram illustrating a chip configuration example of the solid-state imaging device according to the present embodiment. As illustrated in FIG. 4, the solid-state imaging device 100 has a structure of a laminated chip 50 having a light-receiving chip 51 and a circuit chip 52 laminated on the top and bottom thereof, for example. The light-receiving chip 51 is, for example, a semiconductor chip including the semiconductor substrate 40 serving as light-receiving elements in the unit pixels 20, and the circuit chip 52 is, for example, a semiconductor chip in which the read circuits 20A and 20B in the unit pixels 20, peripheral circuits, and the like are formed.

For bonding of the light-receiving chip 51 and the circuit chip 52, for example, so-called direct bonding of flattening bonding surfaces of the light-receiving chip 51 and the circuit chip 52 and bonding them using a force between electrons can be used. However, the present disclosure is not limited thereto and, for example, so-called Cu—Cu bonding of bonding electrode pads formed of copper (Cu) formed on the mutual bonding surfaces, bump bonding, and the like may also be used.

In addition, the light-receiving chip 51 and the circuit chip 52 are electrically connected, for example, through a connecting part such as a through-silicon via (TSV) that penetrates the semiconductor substrate. For connection using a TSV, for example, so-called a twin TSV method of connecting two TSVs, a TSV provided in the light-receiving chip 51 and a TSV provided from the light-receiving chip 51 to the circuit chip 52, to the external surfaces of the chips, so-called a shared TSV method of connecting the light-receiving chip 51 and the circuit chip 52 using a TSV penetrating from the light-receiving chip 51 to the circuit chip 52, and the like can be used.

However, when Cu—Cu bonding or bump bonding is used for bonding of the light-receiving chip 51 and the circuit chip 52, they are electrically connected through a Cu—Cu bonding part and a bump bonding part.

Figure 16:
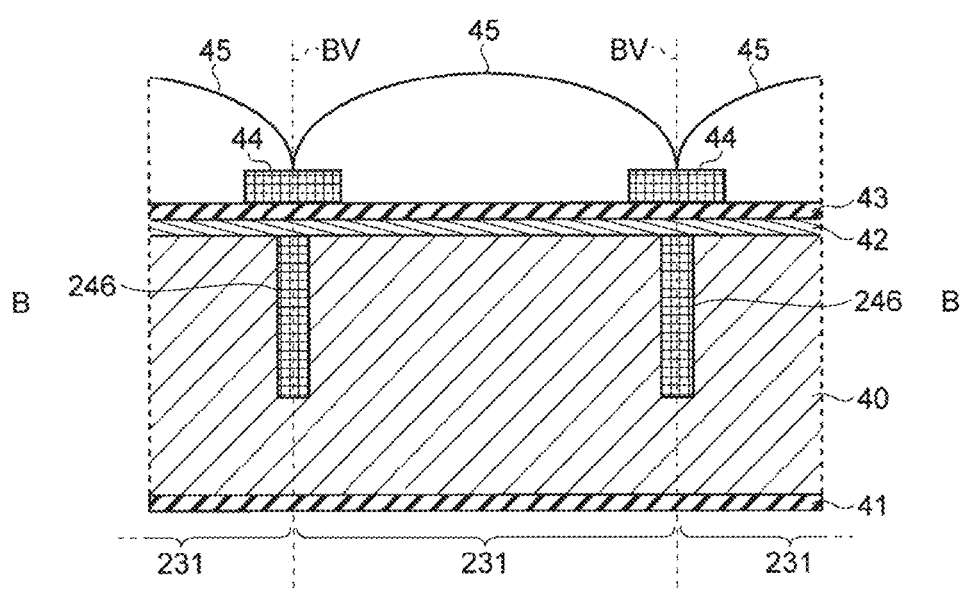
FIG. 16 is a cross-sectional view illustrating an example of a cross-sectional structure of a plane B-B in FIG. 15.

Further, the laminated chip 50 illustrated in FIG. 16 may include the arithmetic operation unit 15, the light-emitting unit 13, the control unit 11, and the like in addition to the solid-state imaging device 100.

1.6 Example of Planar Layout of Light-Receiving Elements

Figure 5:
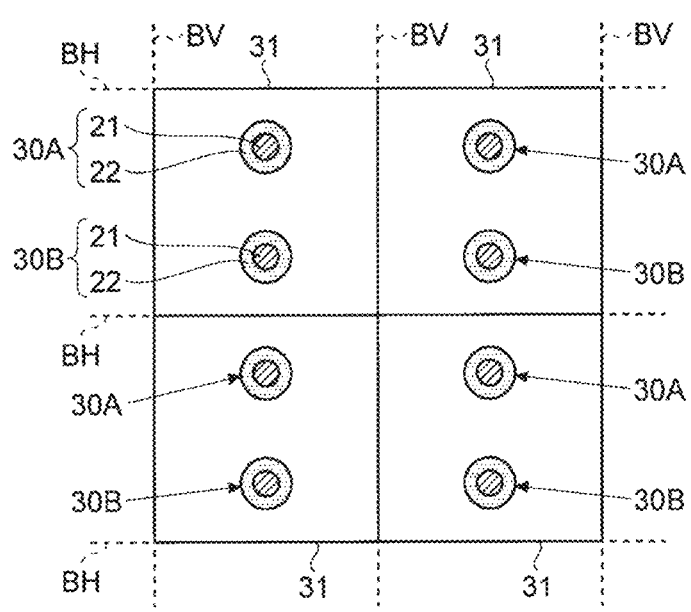
FIG. 5 is a plan view illustrating an example of a layout of light-receiving elements according to the first embodiment.

Subsequently, an example of a planar layout of the light-receiving element 31 in the pixel array unit 101 will be described in detail with reference to the drawings. FIG. 5 is a plan view illustrating an example of a layout of the light-receiving element according to the present embodiment. In addition, FIG. 6 is a plan view illustrating an example of a size of the light-receiving element illustrated in FIG. 5.

As illustrated in FIG. 5, the pixel array unit 101 has a configuration in which a plurality of light-receiving elements 31 are arranged in a two-dimensional lattice form. Each light-receiving element 31 includes the two signal extraction parts 30A and 30B separately disposed in the column direction near the center thereof, for example. Each signal extraction part 30A/30B includes, for example, the MIX 21 having a circular cross section along the arrangement plane of the light-receiving elements 31, and the DET 22 provided to surround the MIX 21.

Figure 6:
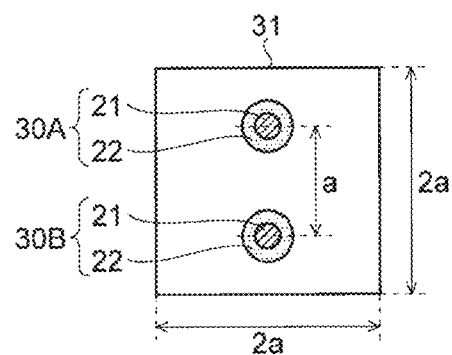
FIG. 6 is a plan view illustrating an example of a size of the light-receiving element illustrated in FIG. 5.

Here, when a distance between the centers of the signal extraction parts 30A and 30B in each light-receiving element 31 is a, as illustrated in FIG. 6, each light-receiving element 31 is provided in a rectangular region having a length of 2a in the column direction, for example. Meanwhile, although the region of the light-receiving element 31 also has a length of 2a in the row direction and thus is illustrated as a square in FIG. 6, the region is not limited to the square and may have various modified shapes.

1.7 Optical Separation Between Light-Receiving Elements

Figure 7:
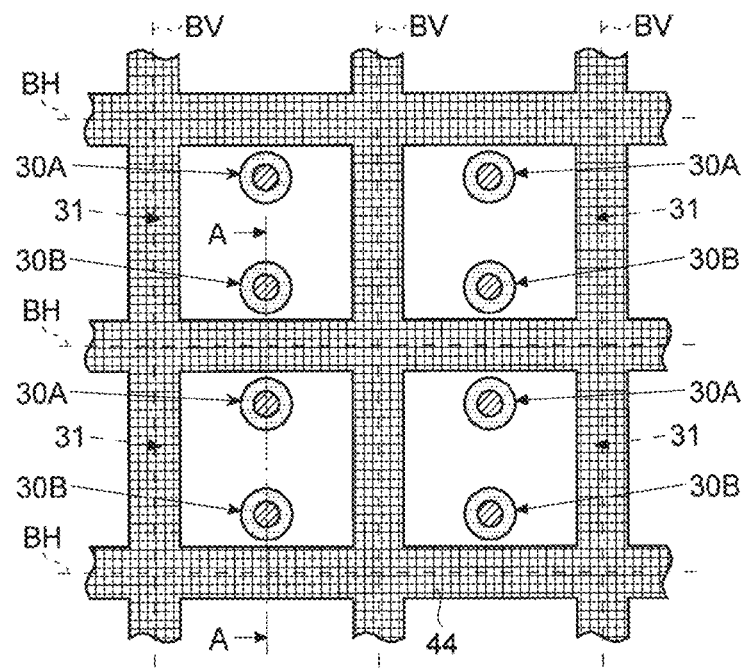
FIG. 7 is a top view illustrating a positional relationship between the light-receiving elements and a light-shielding film when a semiconductor substrate according to the first embodiment is viewed in a direction perpendicular to a light incident surface.

A light-shielding film may be provided at boundaries between the light-receiving elements 31 arranged in the two-dimensional lattice form in the pixel array unit 101, for example, for the purpose of preventing light from leaking into adjacent pixels. FIG. 7 is a top view illustrating a positional relationship between the light-receiving elements and the light-shielding film when the semiconductor substrate according to the present embodiment is viewed in a direction perpendicular to a light incident surface.

As illustrated in FIG. 7, the light-shielding film 44 is provided in a lattice form along boundaries BV and BH of a plurality of light-receiving elements 31 arranged in a two-dimensional lattice form, for example. In such a case, openings formed by the light-shielding film 44 are arranged in a two-dimensional lattice form.

In addition, the signal extraction parts 30A and 30B in each light-receiving element 31 are formed, for example, in regions adjacent to or overlapping the edges of the openings of the light-shielding film 44 when viewed in a direction perpendicular to the light incident surface in the semiconductor substrate 40, as illustrated in FIG. 7.

Figure 8:
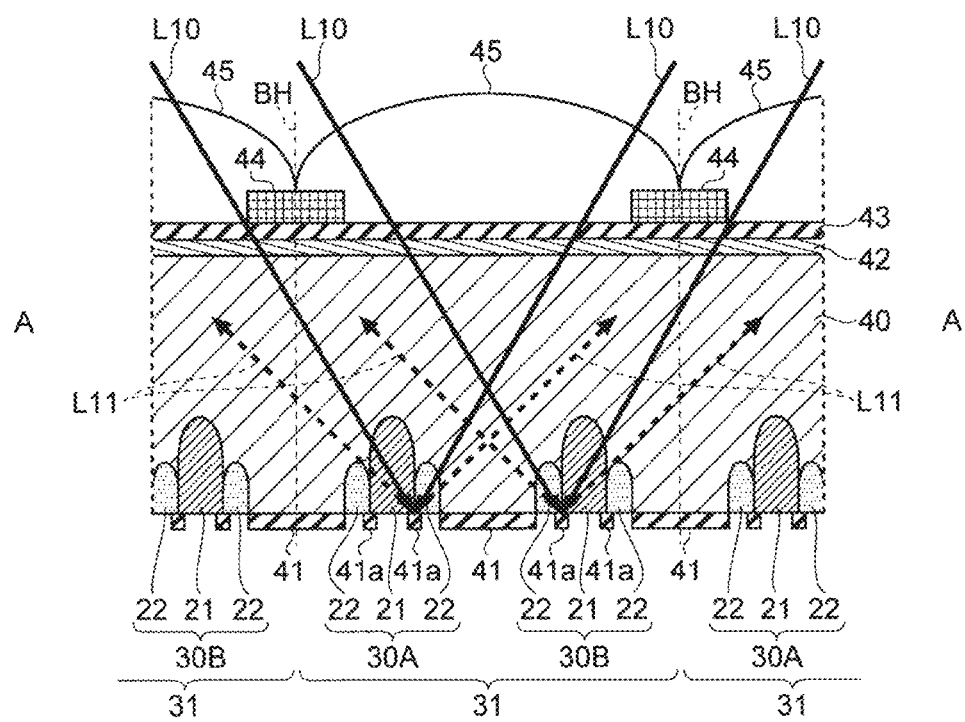
FIG. 8 is a diagram for describing traveling of light incident on a light-receiving element that does not include pixel separating parts.

However, when only the light-shielding film 44 is disposed on the light incident surface of the semiconductor substrate 40 (the lower surface side in the figure, which corresponds to the back surface of the semiconductor substrate 40), there is a possibility that incident light L10 incident on a part 41a for electrically separating between the MIX 21 and the DET 22 of each signal extraction part 30A/30B in an insulating layer 41 formed on the front surface side (the lower surface side in the figure) of the semiconductor substrate 40 is diffused-reflected and reflected light L11 of the incident light L10 is incident on light-receiving elements 31 of adjacent pixels to cause color mixing, as illustrated in FIG. 8.

Accordingly, in the present embodiment, pixel separating parts for optically separating between light-receiving elements 31 are provided as will be described later using FIG. 9 and FIG. 10. Accordingly, color mixing due to leaking of the reflected light L11 diffused-reflected by the part 41a into adjacent pixels is reduced, and thus a pixel separation characteristic of optically separating between light-receiving elements 31 can be improved. Meanwhile, FIG. 8 illustrates an example of a cross-sectional structure in a case where the pixel separating parts have been omitted from an example of a structure illustrated in FIG. 9 which will be described later.

1.8 Example of Cross-Sectional Structure of Unit Pixel

Figure 9:
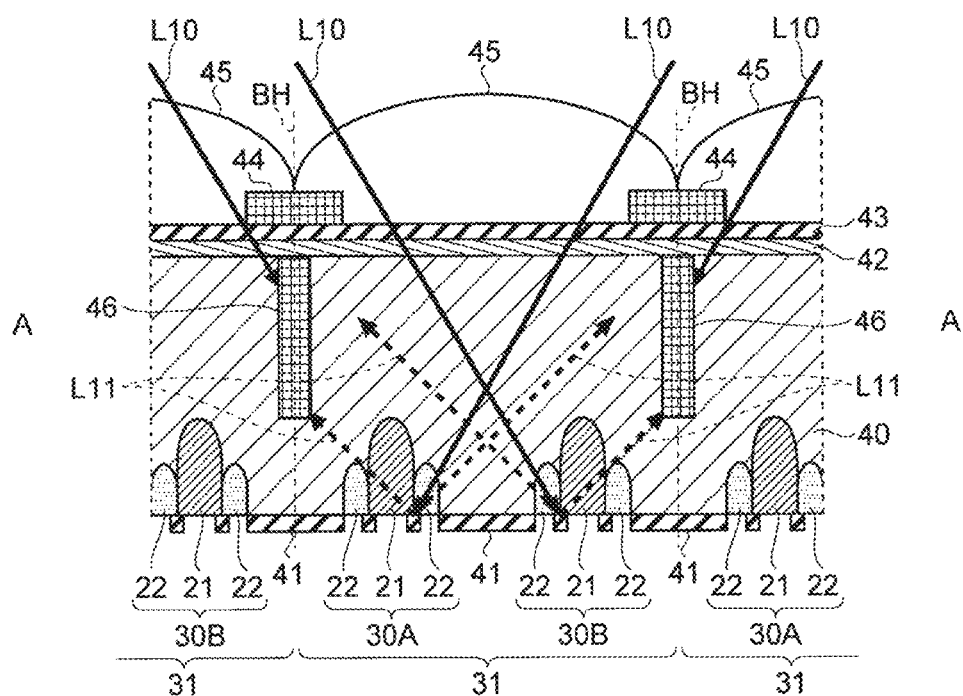
FIG. 9 is a cross-sectional view illustrating a schematic configuration example of the light-receiving element according to the first embodiment.

FIG. 9 is a cross-sectional view illustrating a schematic configuration example of the light-receiving element according to the present embodiment. Further, FIG. 9 illustrates an example of a cross-sectional structure of the part of the light-receiving chip 51 in the so-called back side radiation type solid-state imaging device 100, which corresponds to a section A-A in FIG. 7. Furthermore, FIG. 10 is a top view illustrating a positional relationship between light-receiving elements and the pixel separating parts when a semiconductor substrate illustrated in FIG. 9 is viewed in a direction perpendicular to a light incident surface.

First, the light-receiving element 31 in each unit pixel 20 includes, for example, the semiconductor substrate 40 such as a silicon substrate having a p-type well (p-well), an antireflection film 42 provided on the back surface side of the semiconductor substrate 40 (the upper surface side in the figure), a planarization film 43 provided on the antireflection film 42, and the on-chip lens 45 provided on the planarization film 43, as illustrated in FIG. 9. Further, the circuit chip 52 may be bonded onto the front surface side of the semiconductor substrate 40 (the lower surface side in the figure) through the insulating layer 41 such as a silicon oxide layer.

In addition, the light-shielding film 44 for preventing color mixing between adjacent pixels is provided at the boundary between adjacent light-receiving elements 31 on the planarization film 43. A material having light shielding property, such as tungsten (W), for example, may be used for the light-shielding film 44.

Figure 10:
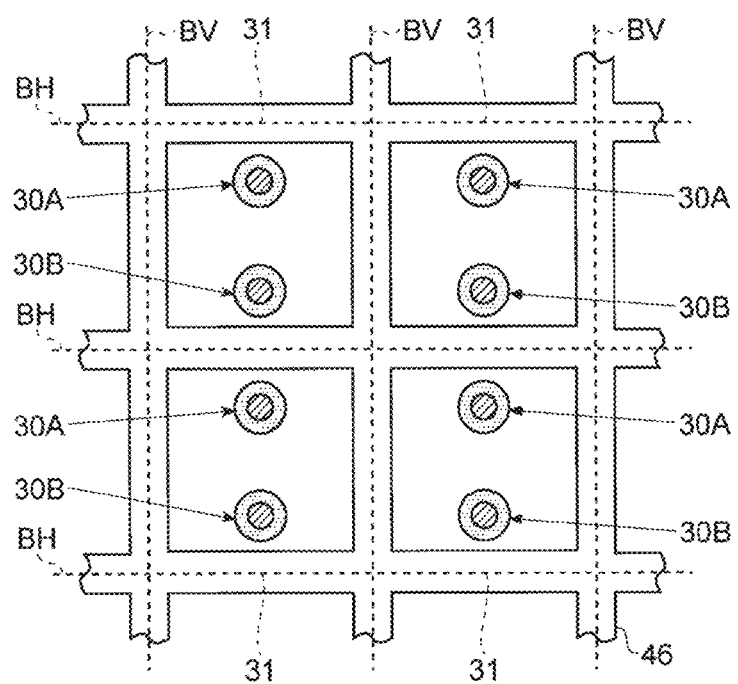
FIG. 10 is a top view illustrating a positional relationship between the light-receiving elements and the pixel separating parts when a semiconductor substrate illustrated in FIG. 9 is viewed in a direction perpendicular to a light incident surface.

Furthermore, the pixel separating parts 46 for optical separating between adjacent light-receiving elements 31 are provided, for example, at the boundaries BV and BH of the light-receiving elements 31 in the semiconductor substrate 40, as illustrated in FIG. 9 and FIG. 10. In other words, the pixel separating parts 46 optically divide the semiconductor substrate 40 into a plurality of pixel regions (corresponding to the light-receiving elements 31) arranged in a matrix form. These pixel separating parts 46 may be, for example, reverse deep trench isolation (RDTI) type pixel separating parts protruding from the back surface (upper surface in the figure) of the semiconductor substrate 40 to the front surface side (lower surface side in the figure).

In addition, these pixel separating parts 46 may be provided in a lattice form along the boundaries BV and BH of the light-receiving elements 31, as illustrated in FIG. 10. In such a case, the pixel separating parts 46 are provided at positions corresponding to the light-shielding film 44 having the back surface of the semiconductor substrate 40 interposed therebetween. That is, the pixel separating parts 46 are covered with the light-shielding film 44 when the semiconductor substrate 40 is viewed in a direction perpendicular to the light incident surface.

Further, the pixel separating parts 46 and the semiconductor substrate 40 may be electrically separated from each other using an insulating layer or the like. This is the same in a pixel separating part in an embodiment which will be described later.

A semiconductor substrate such as a silicon substrate can be used as the semiconductor substrate 40, and the substrate thickness thereof is reduced to lower than 20 μm (micrometers), for example. Further, the thickness of the semiconductor substrate 40 may be equal to or greater than 20 μm and may be appropriately set according to characteristics and the like at which the solid-state imaging device 100 is aimed.

The antireflection film 42 may be, for example, a film formed using a high refractive material such as silicon oxynitride (SiON). In addition, the planarization film 43 may be, for example, a film formed using an insulating material such as silicon oxide (SiO$_2$).

For the pixel separating parts 46, a light-shielding material such as tungsten (W) or a high refractive index material (e.g., a material having a reflective index higher than that of the semiconductor substrate 40) may be used.

One pair of signal extraction parts 30A and 30B is provided in a region of the front surface side of the semiconductor substrate 40 (lower surface side in the figure).

Here, the MIX 21 in each signal extraction part 30A/30B may be a region in which an acceptor such as boron (B) has been diffused into the semiconductor substrate 40, and the DET may be a region in which a donor such as phosphorus (P) or arsenic (As) has been diffused into the semiconductor substrate 40, for example.

The DET of each signal extraction part 30A/30B serves as a charge detection part for detecting the amount of light incident on the light-receiving element 31 from the outside, that is, the amount of charge generated according to photoelectric conversion by the semiconductor substrate 40.

On the other hand, the MIX 21 serves as a voltage application part for injecting majority carrier current into the semiconductor substrate 40, that is, for directly applying a voltage to the semiconductor substrate 40 to generate electric fields in the semiconductor substrate 40.

In the present embodiment, for example, the FD 26 of the read circuit 20A or 20B is directly connected to the DET 22 of the signal extraction part 30A or 30B (refer to FIG. 3).

In addition, silicon oxide (SiO$_2$), a transparent resin, or the like may be used for the on-chip lens 45, for example, and a curvature of the on-chip lens 45 is set such that incident light focuses near the center of the light-receiving element 31.

Since photoelectric conversion of the incident light L10 near the signal extraction part 30A or 30B is reduced according to focusing of the incident light L10 near the center of each light-receiving element 31 through the on-chip lens 45, excessive photoelectric conversion can be curbed. Accordingly, unintended inflow of charge into the DET 22 of the signal extraction part 30A or 30B can be reduced, and thus the pixel separation characteristic can be further improved.

1.9 Operation and Effects

As described above, according to the present embodiment, the pixel separating parts 46 are provided between light-receiving elements 31, and thus color mixing due to leaking of the reflected light L11 diffused-reflected by the part 41a into adjacent pixels can be reduced. As a result, the pixel separation characteristic of optically separating between the light-receiving elements 31 is improved and thus deterioration of distance measurement accuracy can be curbed.

Further, although a case in which the semiconductor substrate 40 is a p-type well, the MIX 21 is a p+ semiconductor region having a conductivity type of p, and the DET 22 is an n+ semiconductor region having a conductivity type of n is exemplified in the present embodiment, the present disclosure is not limited thereto and, for example, the semiconductor substrate 40 may be an n-type well, the MIX 21 may be an n+ semiconductor region having a conductivity type of n, and the DET 22 may be a p+ semiconductor region having a conductivity type of p. This is the same in an embodiment which will be described later.

1.10 Modified Examples of Pixel Separating Parts

In addition, although so-called the RDTI type pixel separating parts 46 formed from the back surface (upper surface in the figure) to the halfway point of the semiconductor substrate 40 are exemplified in the present embodiment, the present disclosure is not limited thereto. Accordingly, some modified examples of the pixel separating parts will be exemplified below.

1.10.1 First Modified Example

Figure 11:
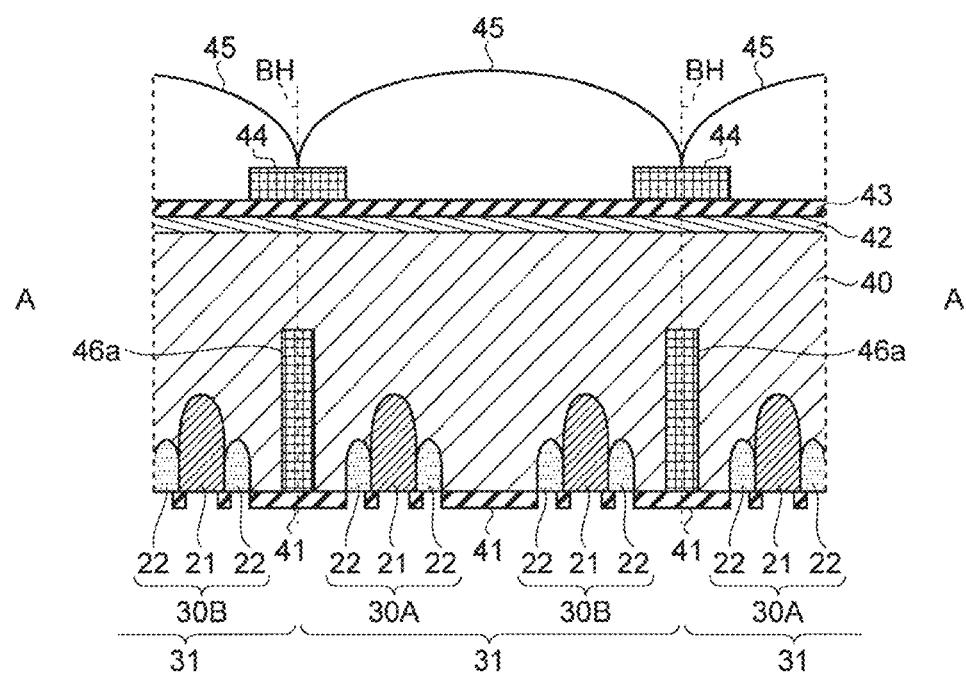
FIG. 11 is a cross-sectional view illustrating a schematic configuration example of a light-receiving element according to a first modified example of the first embodiment.

FIG. 11 is a cross-sectional view illustrating a schematic configuration example of a light-receiving element according to a first modified example. Further, FIG. 11 illustrates an example of the cross-sectional structure of the part of the light-receiving chip 51 in so-called the back side radiation type solid-state imaging device 100 as in FIG. 9, which corresponds to the cross section A-A in FIG. 7.

As illustrated in FIG. 11, the light-receiving element 31 according to the first modified example has a cross-sectional structure in which the pixel separating parts 46 exemplified in FIG. 9 have been substituted with, for example, DTI type pixel separating parts 46a protruding from the front surface (lower surface in the figure) to the back surface side (lower surface side in the figure) of the semiconductor substrate 40. These pixel separating parts 46a may be provided in a lattice form along the boundaries BV and BH of the light-receiving elements 31 like the pixel separating parts 46 (refer to FIG. 10).

In this manner, color mixing due to leaking of the reflected light L11 diffused-reflected by the part 41a into adjacent pixels can also be reduced by the DTI type pixel separating parts 46a formed from the front surface side of the semiconductor substrate 40. Accordingly, the pixel separation characteristic of optically separating between light-receiving elements 31 is improved, and thus deterioration of the distance measurement accuracy can be curbed.

1.10.2 Second Modified Example

Figure 12:
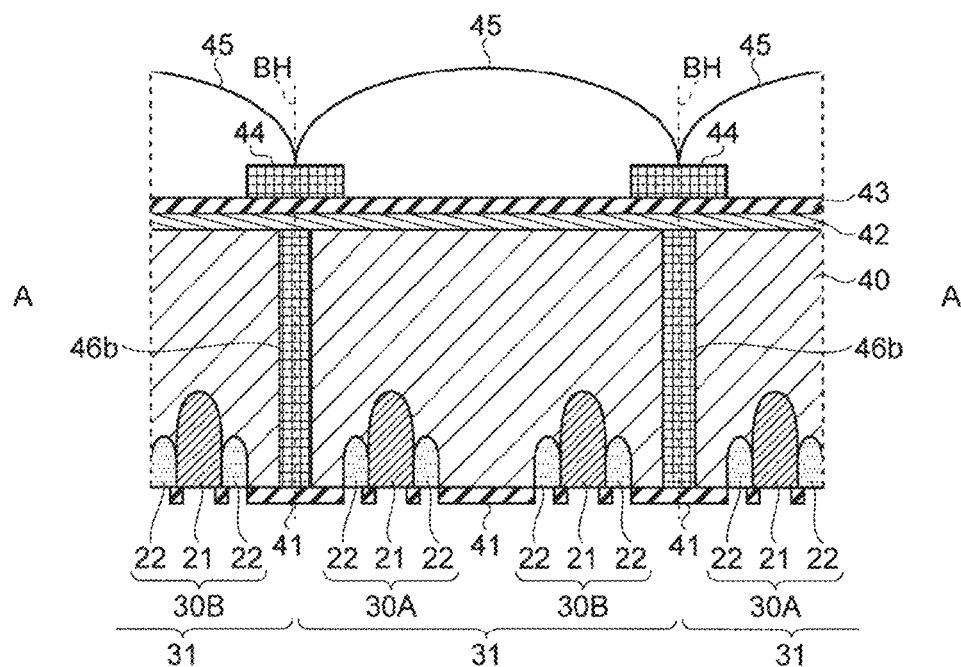
FIG. 12 is a cross-sectional view illustrating a schematic configuration example of a light-receiving element according to a second modified example of the first embodiment.

FIG. 12 is a cross-sectional view illustrating a schematic configuration example of a light-receiving element according to a second modified example. Further, FIG. 12 illustrates an example of the cross-sectional structure of the part of the light-receiving chip 51 in so-called the back side radiation type solid-state imaging device 100 as in FIG. 9 and FIG. 11, which corresponds to the cross section A-A in FIG. 7.

As illustrated in FIG. 12, the light-receiving element 31 according to the first modified example has a cross-sectional structure in which the pixel separating parts 46 exemplified in FIG. 9 have been substituted with, for example, front full trench isolation (FFTI) type pixel separating parts 46b penetrating the front and back surfaces of the semiconductor substrate 40. These pixel separating parts 46b may be provided in a lattice form along the boundaries BV and BH of the light-receiving elements 31 like the pixel separating parts 46 (refer to FIG. 10).

In this manner, it is possible to further improve the pixel separation characteristic by optically separating between light-receiving elements 31 using the FFTI type pixel separating parts 46b penetrating the front and back surfaces of the semiconductor substrate 40, and thus deterioration of the distance measurement accuracy can be curbed.

2. Second Embodiment

Next, a second embodiment will be described below in detail with reference to the drawings. Meanwhile, redundant description will be omitted with respect to the same configurations, operations, and effects as those of the above-described embodiment by citing the above-described embodiment in the following description.

2.1 Example of Planar Layout of Light-Receiving Elements

Figure 13:
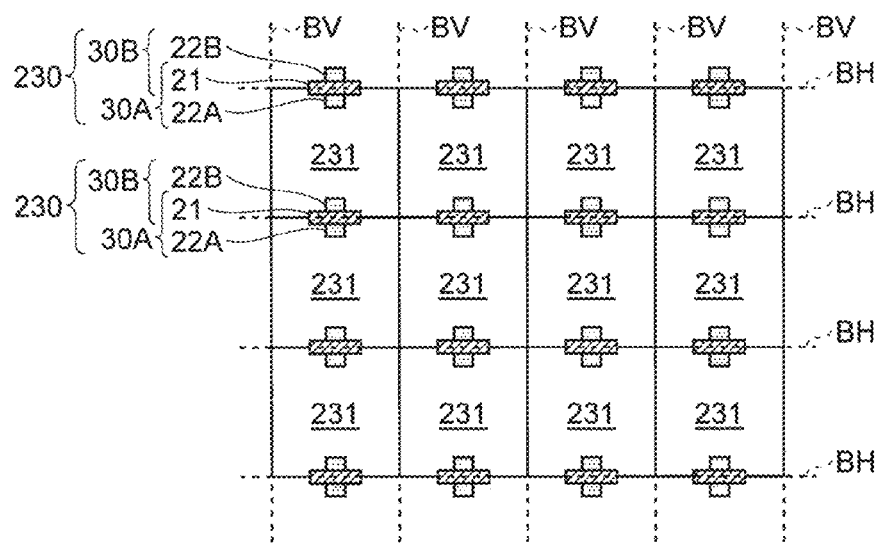
FIG. 13 is a plan view illustrating an example of a layout of a light-receiving element according to a second embodiment.
Figure 14:
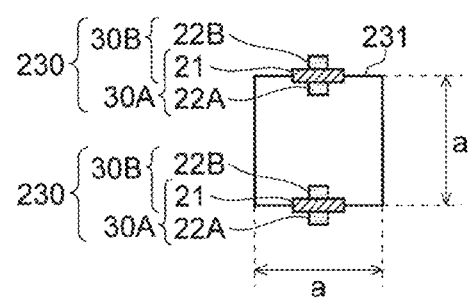
FIG. 14 is a plan view illustrating an example of a size of the light-receiving element illustrated in FIG. 13.

FIG. 13 is a plan view illustrating an example of a layout of light-receiving elements according to the present embodiment and FIG. 14 is a plan view illustrating an example of a size of the light-receiving element illustrated in FIG. 13.

As illustrated in FIG. 13, the pixel array unit 101 according to the present embodiment has a configuration in which a plurality of light-receiving elements 231 are arranged in a two-dimensional lattice form. PN semiconductor regions 230 are provided at respective boundaries of the light-receiving elements 231 in the column direction (vertical direction in the figure).

Each PN semiconductor region 230 includes, for example, a MIX 21 positioned at each boundary of the light-receiving element 231, a DET 22A adjacent to the MIX 21 thereunder in the column direction, and a DET 22B adjacent to the MIX 21 thereon in the column direction. A length of the DET 22A and DET 22B in the row direction with respect to the MIX 21 may be shorter than a length of the MIX 21 in the row direction, for example. In such a case, since the influence of the DET 22A and the DET 22B on electric fields formed by two MIXs 21 in the light-receiving element 231 can be reduced, charge can be efficiently collected in the DET 22A or 22B and thus deterioration of quantum efficiency can be curbed.

In this configuration, the MIX 21 and the DET 22A in each PN semiconductor region 230 constitute the signal extraction part 30A of a lower light-receiving element 231 between two light-receiving elements 231 forming each boundary, and the MIX 21 and the DET 22B constitute the signal extraction part 30B of an upper light-receiving element 231. That is, the MIX 21 positioned at the boundary between two light-receiving elements 231 is shared by these two light-receiving elements 231.

Here, when the distance between the centers of the MIXs 21 in the signal extraction parts 30A and 30B is a as in the light-receiving element 31 according to the first embodiment, each light-receiving element 231 can take a rectangular region having a length of a in the column direction, as illustrated in FIG. 14.

That is, the distance between the centers of the MIXs 21 can be set to a pixel pitch of the light-receiving elements 231 as it is by employing a configuration in which vertically adjacent two light-receiving elements 231 share the MIX 21 as in the present embodiment. Accordingly, a degree of integration of light-receiving elements 231 in the column direction can be increased, and thus the resolution in the column direction can be improved. Here, the resolution of the row direction can also be doubled, for example, by forming a plane region of the light-receiving element 231 as a square.

2.2 Example of Planar Layout of Pixel Separating Parts

Next, some examples of a planar layout of pixel separating parts 246 according to the present embodiment will be exemplified.

2.2.1 First Example

Figure 15:
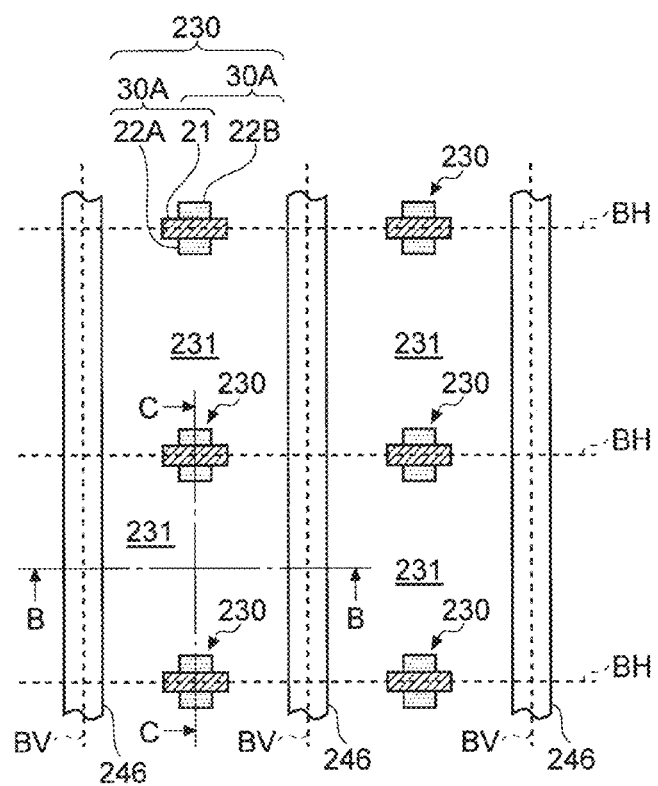
FIG. 15 is a diagram illustrating an example of a planar layout of pixel separating parts according to a first example of the second embodiment.
Figure 17:
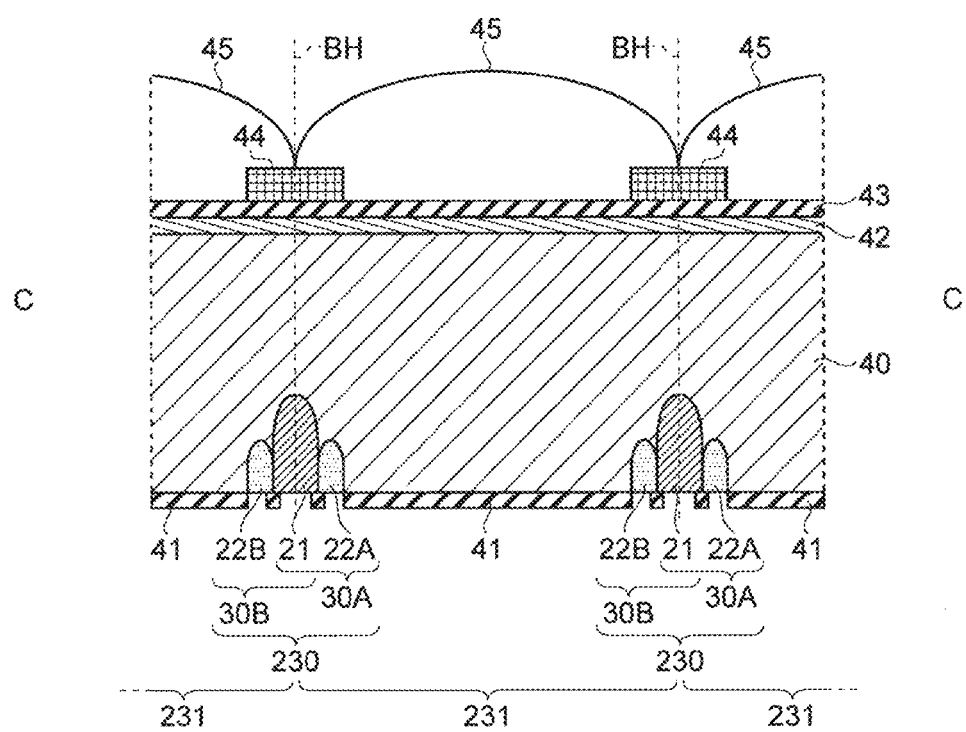
FIG. 17 is a cross-sectional view illustrating an example of a cross-sectional structure of a plane C-C in FIG. 15.

FIG. 15 is a diagram illustrating an example of a planar layout of pixel separating parts according to a first example and a top view illustrating a positional relationship between light-receiving elements and the pixel separating parts when a semiconductor substrate according to the present embodiment is viewed in a direction perpendicular to a light incident surface. FIG. 16 is a cross-sectional view illustrating an example of a cross-sectional structure of a plane B-B in FIG. 15, and FIG. 17 is a cross-sectional view illustrating an example of a cross-sectional structure of a plane C-C in FIG. 15.

As illustrated in FIG. 15, the pixel separating parts 246 according to the first example are formed along boundaries BV extending in the column direction among boundaries BV and BH of light-receiving elements 231, for example.

In such a case, RDTI type pixel separating parts 246 protruding from the back surface (upper surface in the figure) to the front surface side (lower surface side in the figure) of the semiconductor substrate 40 appear at boundaries BV of light-receiving elements 231 in the column direction, for example, on the plane B-B that cross-sections near the centers of the light-receiving elements 231 in the row direction, as illustrated in FIG. 16.

The pixel separating parts 246 are provided at positions corresponding to the light-shielding film 44 having the back surface of the semiconductor substrate 40 interposed therebetween. That is, the pixel separating parts 246 are covered with a part extending in the column direction in the light-shielding film 44 when the semiconductor substrate 40 is viewed in a direction perpendicular to a light incident surface.

Further, the RDTI type pixel separating parts 246 protruding from the back surface to the front surface side of the semiconductor substrate 40 may be modified into DTI type pixel separating parts protruding from the front surface to the back surface of the semiconductor substrate 40 (refer to FIG. 11), an FFTI type pixel separating parts penetrating the front and back surfaces of the semiconductor substrate 40 (refer to FIG. 12), and the like in various manners.

On the other hand, the MIX 21 appears at boundaries BH of light-receiving elements 231 in the row direction and DET 22A and DET 22B appear at positions at which the MIX 21 is interposed therebetween, for example, on the plane C-C that cross-sections near the centers of the light-receiving elements 231 in the column direction, as illustrated in FIG. 17.

In such a case, the PN semiconductor region 230 including the MIX 21, the DET 22A, and the DET 22B is provided at a position corresponding to the light-shielding film 44 having the back surface of the semiconductor substrate 40 interposed therebetween. That is, the PN semiconductor region 230 is covered with a part extending in the row direction in the light-shielding film 44 when the semiconductor substrate 40 is viewed in a direction perpendicular to the light incident surface.

As described above, it is possible to reduce leaking of the reflected light L11 into light-receiving elements 231 adjacent in the row direction by providing the pixel separating parts 246 between light-receiving elements 231 adjacent in the row direction. Accordingly, the pixel separation characteristic of optically separating between light-receiving elements 231 is improved, and thus deterioration of the distance measurement accuracy can be curbed.

2.2.2 Second Example

Figure 18:
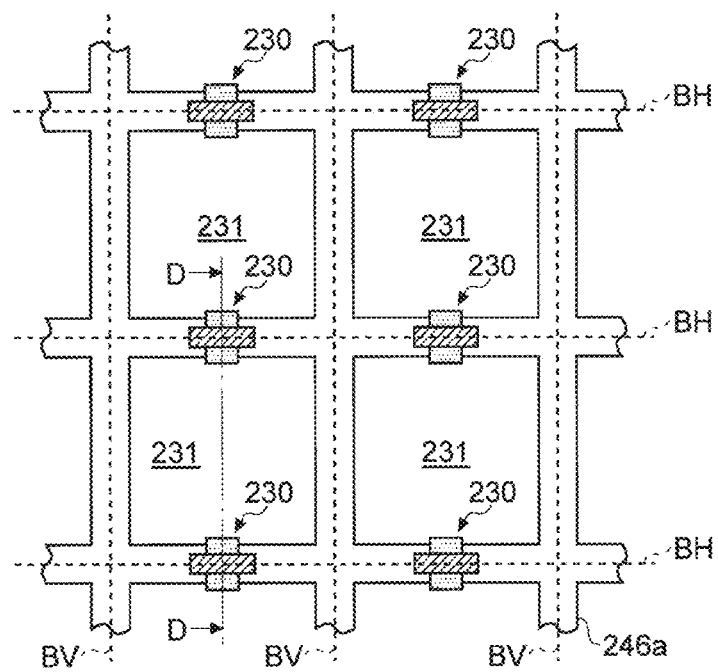
FIG. 18 is a diagram illustrating an example of a planar layout of pixel separating parts according to a second example of the second embodiment.
Figure 19:
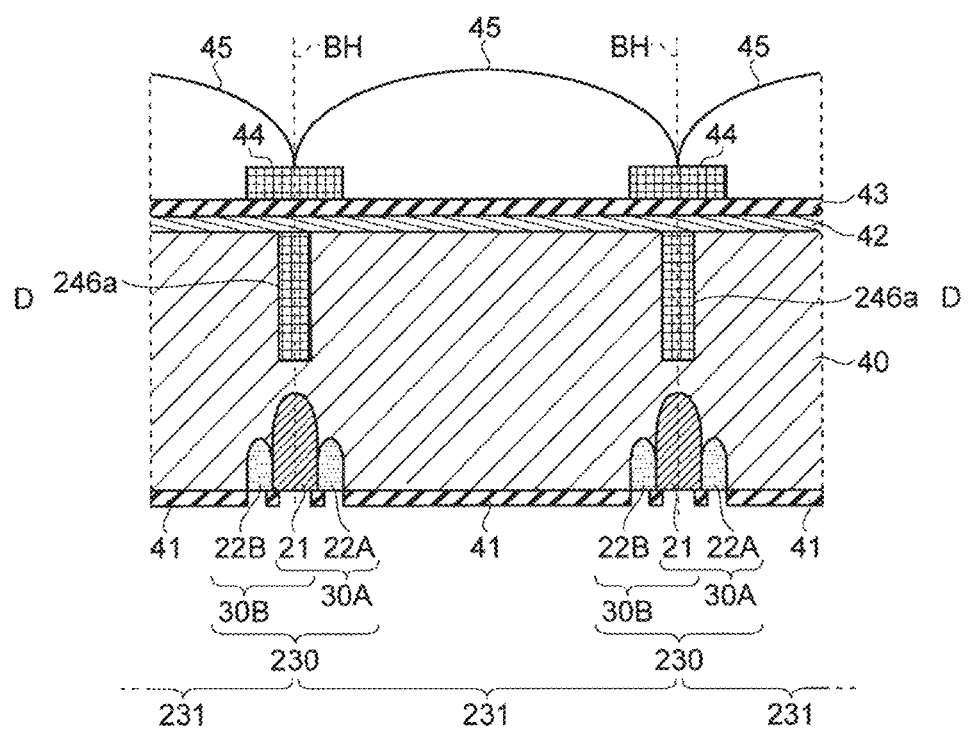
FIG. 19 is a cross-sectional view illustrating an example of a cross-sectional structure of a plane D-D in FIG. 18.

FIG. 18 is a diagram illustrating an example of a planar layout of pixel separating parts according to a second example and a top view illustrating a positional relationship between light-receiving elements and the pixel separating parts when the semiconductor substrate according to the present embodiment is viewed in a direction perpendicular to the light incident surface. FIG. 19 is a cross-sectional view illustrating an example of a cross-sectional structure of a plane D-D in FIG. 18.

As illustrated in FIG. 18, pixel separating parts 246*a* are provided in a lattice form along boundaries BV and BH of light-receiving elements 231, for example, in the second example.

In such a case, for example, PN semiconductor regions 230 positioned at boundaries BH of light-receiving elements 231 in the row direction and RDTI type pixel separating parts 246*a* protruding from the back surface (upper surface in the figure) to the front surface side (lower surface side in the figure) of the semiconductor substrate 40 appear on the plane D-D that cross-sections near the centers of light-receiving elements 231 in the column direction, as illustrated in FIG. 19. Further, the cross-sectional structure of the plane that cross-sections near the centers of the light-receiving elements 231 may be the same as, for example, the cross-sectional structure described using FIG. 17 in the first example.

The pixel separating parts 246*a* are provided at positions corresponding to the light-shielding film 44 having the back surface of the semiconductor substrate 40 interposed therebetween. That is, the pixel separating parts 246*a* in a lattice form are covered with the light-shielding film 44 in the same lattice form when the semiconductor substrate 40 is viewed in a direction perpendicular to a light incident surface.

Further, the RDTI type pixel separating parts 246*a* protruding from the back surface to the front surface side of the semiconductor substrate 40 may be modified into DTI type pixel separating parts protruding from the front surface to the back surface of the semiconductor substrate 40 (refer to FIG. 11), an FFTI type pixel separating parts penetrating the front and back surfaces of the semiconductor substrate 40 (refer to FIG. 12), and the like in various manners. However, when the FFTI type is employed, parts intersecting (overlapping) the PN semiconductor regions 230 may be cut off, or the parts overlapping the PN semiconductor regions 230 may be configured as the RDTI type, as in a third example which will be described later.

As described above, leaking of the reflected light L11 in the column direction as well as the row direction can be reduced by surrounding each light-receiving element 231 with the pixel separating parts 246*a* in a lattice form. Accordingly, the pixel separating characteristic of optical separating between the light-receiving elements 231 is improved, and thus deterioration of the distance measurement accuracy can be further curbed.

2.2.3 Third Example

Figure 20:
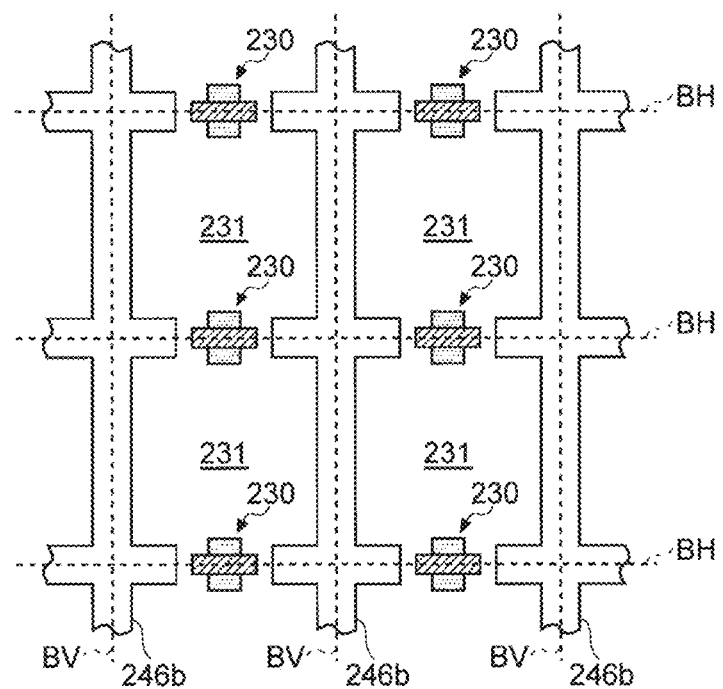
FIG. 20 is a diagram illustrating an example of a planar layout of pixel separating parts according to a third example of the second embodiment.

FIG. 20 is a diagram illustrating an example of a planar layout of pixel separating parts according to a third example and a top view illustrating a positional relationship between light-receiving elements and the pixel separating parts when the semiconductor substrate according to the present embodiment is viewed in a direction perpendicular to the light incident surface.

As illustrated in FIG. 20, the pixel separating parts 246*b* according to the third example has a shape in which parts intersecting (overlapping) the PN semiconductor regions 230 are cut off in the same configuration as the pixel separating parts 246*a* according to the second example, for example.

In such a case, for example, PN semiconductor regions 230 positioned at boundaries BH of light-receiving elements 231 in the row direction and RDTI type pixel separating parts 246*b* protruding from the back surface (upper surface in the figure) to the front surface side (lower surface side in the figure) of the semiconductor substrate 40 appear on a plane that cross-sections near the centers of light-receiving elements 231 in the column direction, as described in the second example using FIG. 19. Further, the cross-sectional structure of the plane that cross-sections near the centers of the light-receiving elements 231 may be the same as, for example, the cross-sectional structure described using FIG. 17 in the first example.

The pixel separating parts 246*b* are provided at positions corresponding to the light-shielding film 44 having the back surface of the semiconductor substrate 40 interposed therebetween. That is, the pixel separating parts 246*b* are covered with the light-shielding film 44 in a lattice form when the semiconductor substrate 40 is viewed in a direction perpendicular to the light incident surface.

Further, the RDTI type pixel separating parts 246*b* protruding from the back surface to the front surface side of the semiconductor substrate 40 may be modified into DTI type pixel separating parts protruding from the front surface to the back surface of the semiconductor substrate 40 (refer to FIG. 11), an FFTI type pixel separating parts penetrating the front and back surfaces of the semiconductor substrate 40 (refer to FIG. 12), and the like in various manners.

As described above, since the influence of the pixel separating parts 246*b* on electric fields formed by two MIXs 21 in each light-receiving element 231 can be reduced by cutting off regions corresponding to the PN semiconductor regions 230 in the structure in which each light-receiving element 231 is surrounded by the pixel separating parts 246*b* in a lattice form, charge can be efficiently collected in the DET 22A or 22B and thus deterioration of the quantum efficiency can be curbed.

2.3 Operation and Effects

As described above, according to the present embodiment, the distance between the centers of the MIXs 21 can be set to a pixel pitch of the unit pixels 20 as it is because vertically adjacent two unit pixels 20 share one MIX 21. Accordingly, it is possible to improve the distance measurement accuracy while curbing deterioration of the resolution or improve the resolution while curbing deterioration of the distance measurement accuracy because a degree of integration of unit pixels 20 in the column direction can be increased.

In addition, according to the present embodiment, a strong electric field region formed around the signal extraction part 30B or 30A which is not a signal extraction side can be reduced. Accordingly, in the present embodiment, charge generated near the signal extraction part 30B or 30A which is not a signal extraction side can also efficiently gather in the DET 22A of the signal extraction part 30A or the DET 22B of the signal extraction part 30B which is a signal extraction side, and thus substantial quantum efficiency can be improved to increase contrast between pixels.

Furthermore, according to the present embodiment, the effects of a rapid read operation and reading at a low operating voltage can be obtained since charge can be efficiently collected in the DET 22A or 22B of a signal extraction side from a wide range of the semiconductor substrate 40.

Meanwhile, other configurations, operations, and effects are the same as those of the above-described embodiments and thus detailed description thereof is omitted.

3. Third Embodiment

Next, a third embodiment will be described below in detail with reference to the drawings. Meanwhile, redundant description will be omitted with respect to the same configurations, operations, and effects as those of the above-described embodiment by citing the above-described embodiment in the following description.

In the second embodiment, a case in which two light-receiving elements 231 arranged in the column direction share one MIX 21 has been exemplified. On the other hand, in the third embodiment, a case in which four light-receiving elements 231 adjacent in the column direction and the row direction share one MIX 21 will be exemplified.

3.1 Example of Planar Layout of Light-Receiving Elements

Figure 21:
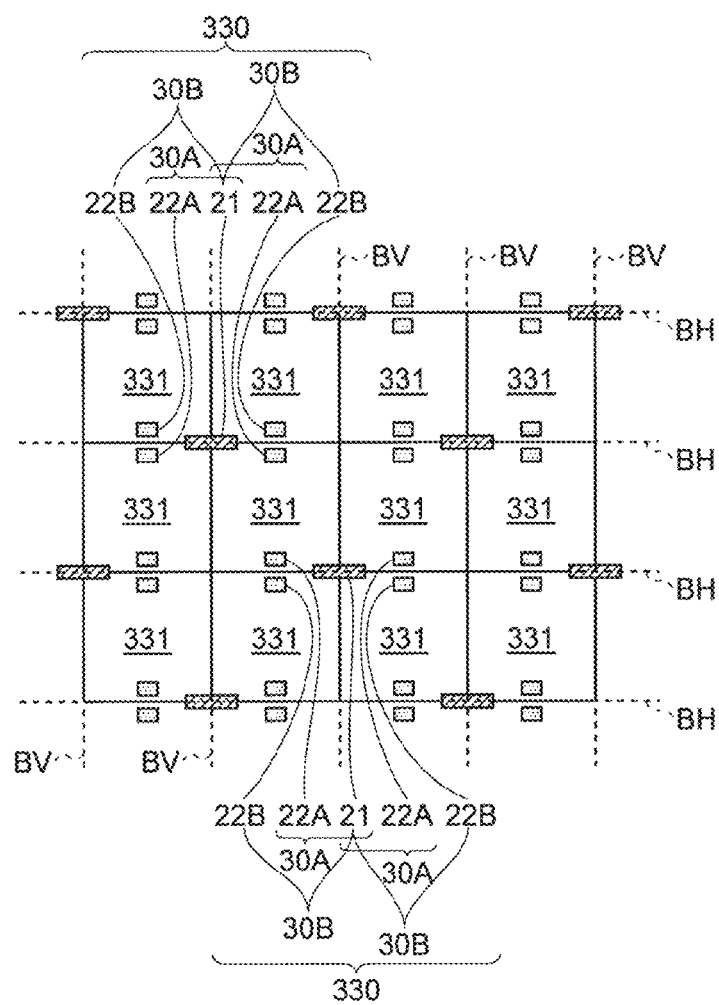
FIG. 21 is a plan view illustrating an example of a layout of light-receiving elements according to a third embodiment.
Figure 22:
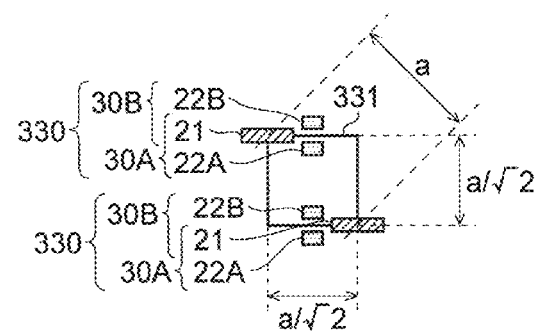
FIG. 22 is a plan view illustrating an example of a size of the light-receiving element illustrated in FIG. 21.

FIG. 21 is a plan view illustrating an example of a layout of light-receiving elements according to the present embodiment and FIG. 22 is a plan view illustrating an example of a size of the light-receiving element illustrated in FIG. 21.

As illustrated in FIG. 21, the pixel array unit 101 according to the present embodiment has a configuration in which a plurality of light-receiving elements 331 are arranged in a two-dimensional lattice form as in the second embodiment.

However, in the present embodiment, four light-receiving elements 331 arranged in the column direction and the row direction by twos are grouped as one group, and MIXs 21 are respectively provided at a center part where corners of the four light-receiving elements 331 meet and four corners of a rectangular region formed by the four light-receiving elements 331. In other words, each MIX 21 is disposed such that it is disposed at a pair of opposite corners in each light-receiving element 31. Further, a MIX 21 provided at each of the four corners of the rectangular region formed by the four light-receiving elements 331 is shared by four light-receiving elements 331 having the MIX 21 at the center thereof.

Each MIX 21 constitutes the signal extraction part 30A or 30B along with DETs 22A or 22B respectively provided in four light-receiving elements 31 sharing the MIX 21. Accordingly, PN semiconductor regions 330 according to the present embodiment includes two signal extraction parts 30A and two signal extraction parts 30B.

Positions of the DETs 22A and 22B in each light-receiving element 31 may be the same as those in the second embodiment, for example, positions near the center at the boundary of each light-receiving element 331 in the column direction.

Here, when the distance between the centers of MIXs 21 in the signal extraction parts 30A and 30B is a and a region in which each light-receiving element 331 is formed is a square, like the light-receiving element 231 according to the second embodiment, for example, each light-receiving element 331 can be formed in a square region having lengths of $a/\sqrt{2}$ in the column direction and the row direction, as illustrated in FIG. 22. That is, it is possible to set a pixel pitch of the light-receiving elements 31 to $1/\sqrt{2}$ of the pixel pitch a in the second embodiment by employing a configuration in which four light-receiving elements 331 arranged in two in a row and two in a column share one MIX 21 as in the present embodiment. Accordingly, it is possible to improve the resolution in the column direction and the row direction because a degree of integration of the light-receiving elements 331 in the column direction and the row direction can be increased. In addition, when the plane region of the light-receiving element 31 according to the second embodiment is a square, the resolution in the row direction can also be $\sqrt{2}$ times.

3.2 Example of Planar Layout of Pixel Separating Parts

Next, some examples of a planar layout of pixel separating parts 346 according to the present embodiment will be exemplified.

3.2.1 First Example

Figure 23:
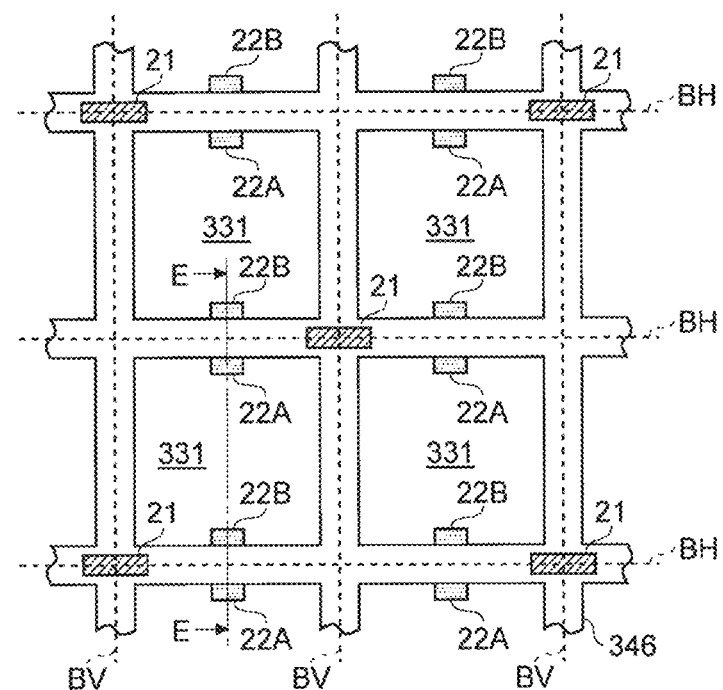
FIG. 23 is a diagram illustrating an example of a planar layout of pixel separating parts according to a first example of the third embodiment.
Figure 24:
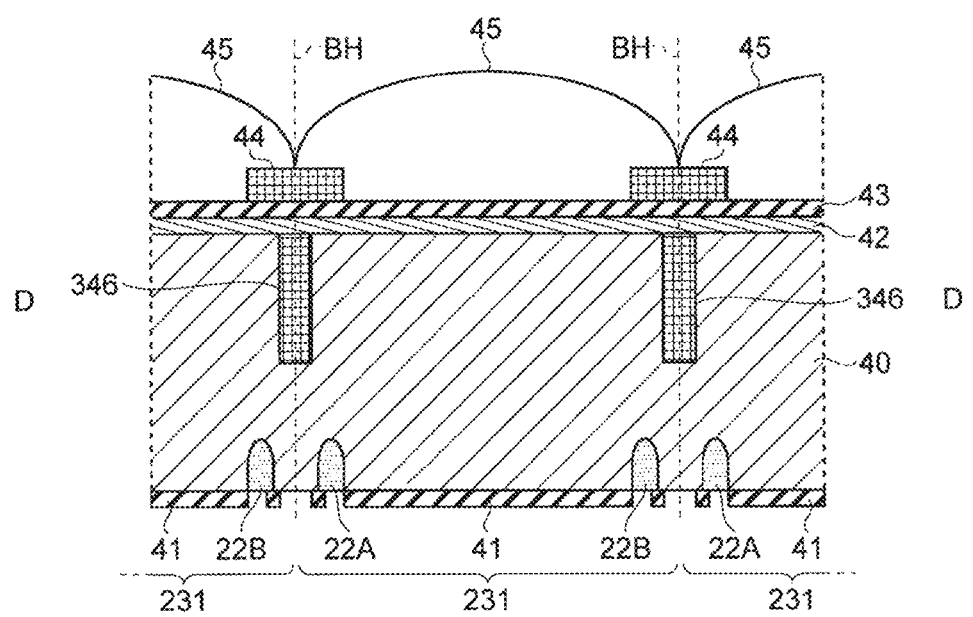
FIG. 24 is a cross-sectional view illustrating an example of a cross-sectional structure of plane E-E in FIG. 23.

FIG. 23 is a diagram illustrating an example of a planar layout of pixel separating parts according to a first example and a top view illustrating a positional relationship between light-receiving elements and the pixel separating parts when a semiconductor substrate according to the present embodiment is viewed in a direction perpendicular to a light incident surface. FIG. 24 is a cross-sectional view illustrating an example of a cross-sectional structure of plane E-E in FIG. 23.

As illustrated in FIG. 23, in the first example, pixel separating parts 346 in a lattice form are provided along boundaries BV and BH of light-receiving elements 331, for example, like the pixel separating parts 246a according to the second example of the second embodiment.

In such a case, for example, DETs 22A and 22B positioned near boundaries BH of light-receiving elements 331 in the row direction and RDTI type pixel separating parts 346 protruding from the back surface (upper surface in the figure) to the front surface side (lower surface side in the figure) of the semiconductor substrate 40 appear on a plane that cross-sections near the centers of the light-receiving elements 331 in the column direction, as illustrated in FIG. 24. Further, the cross-sectional structure of the plane that cross-sections near the centers of the light-receiving elements 331 in the column direction may be, for example, the same as the cross-sectional structure described using FIG. 17 in the first example of the second embodiment.

The pixel separating parts 346 are provided at positions corresponding to the light-shielding film 44 having the back surface of the semiconductor substrate 40 interposed therebetween. That is, pixel separating parts 346 in a lattice form are covered with the light-shielding film 44 in a lattice form likewise when the semiconductor substrate 40 is viewed in a direction perpendicular to the light incident surface.

Further, the RDTI type pixel separating parts 346 protruding from the back surface to the front surface side of the semiconductor substrate 40 may be modified into DTI type pixel separating parts protruding from the front surface to the back surface of the semiconductor substrate 40 (refer to FIG. 11), an FFTI type pixel separating parts penetrating the front and back surfaces of the semiconductor substrate 40 (refer to FIG. 12), and the like in various manners. However, when the FFTI type is employed, parts intersecting (overlapping) the PN semiconductor regions 330 may be cut off, or the parts overlapping the PN semiconductor regions 330 may be configured as the RDTI type, as in a second example which will be described later.

As described above, it is possible to reduce leaking of the reflected light L11 in the column direction as well as the row direction by surrounding each light-receiving element 331 with the pixel separating parts 346 in a lattice form. Accordingly, the pixel separating characteristic of optical separating between the light-receiving elements 331 is improved, and thus deterioration of the distance measurement accuracy can be further curbed.

3.2.2 Second Example

Figure 25:
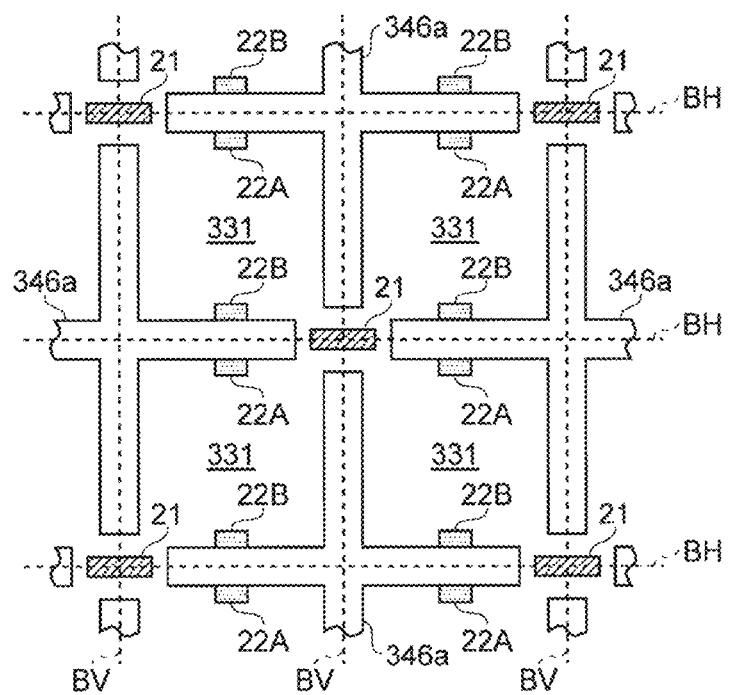
FIG. 25 is a diagram illustrating an example of a planar layout of pixel separating parts according to a second example of the third embodiment.

FIG. 25 is a diagram illustrating an example of a planar layout of pixel separating parts according to a second example and a top view illustrating a positional relationship between light-receiving elements and the pixel separating parts when the semiconductor substrate according to the present embodiment is viewed in a direction perpendicular to the light incident surface.

As illustrated in FIG. 25, pixel separating parts 346a according to the second example have, for example, a shape in which intersection parts overlapping MIXs 21 are cut off in the same configuration as the pixel separating parts 346 according to the first example.

In such a case, for example, DETs 22A and 22B positioned near boundaries BH of light-receiving elements 331 in the row direction and RDTI type pixel separating parts 346a protruding from the back surface (upper surface in the figure) to the front surface side (lower surface side in the figure) of the semiconductor substrate 40 appear on a plane that cross-sections near the centers of the light-receiving elements 331 in the column direction, as described using FIG. 24 in the first example. Further, the cross-sectional structure of the plane that cross-sections near the centers of the light-receiving elements 331 in the column direction may be, for example, the same as the cross-sectional structure described using FIG. 17 in the first example of the second embodiment.

The pixel separating parts 346a are provided at positions corresponding to the light-shielding film 44 having the back surface of the semiconductor substrate 40 interposed therebetween. That is, the pixel separating parts 246b are covered with the light-shielding film 44 in a lattice form when the semiconductor substrate 40 is viewed in a direction perpendicular to the light incident surface.

Further, the RDTI type pixel separating parts 346a protruding from the back surface to the front surface side of the semiconductor substrate 40 may be modified into DTI type pixel separating parts protruding from the front surface to the back surface of the semiconductor substrate 40 (refer to FIG. 11), an FFTI type pixel separating parts penetrating the front and back surfaces of the semiconductor substrate 40 (refer to FIG. 12), and the like in various manners.

As described above, since the influence of the pixel separating parts 346a on electric fields formed by two MIXs 21 in each light-receiving element 331 can be reduced by cutting off regions corresponding to MIXs 21 in the structure in which each light-receiving element 331 is surrounded by the pixel separating parts 346a in a lattice form, charge can be efficiently collected in the DET 22A or 22B and thus deterioration of the quantum efficiency can be curbed.

3.3 Operation and Effects

As described above, according to the present embodiment, it is possible to set $1/\sqrt{2}$ times the distance between the centers of MIXs 21 to the pixel pitch of the light-receiving elements 331 because vertically and horizontally adjacent four light-receiving elements 331 share one MIX 21, and MIXs 21 are positioned at opposite corners of each light-receiving element 331. Accordingly, a degree of integration of the light-receiving elements 331 in the column direction and the row direction can be improved, and thus it is possible to increase the distance measurement accuracy while curbing deterioration of the resolution or increase the resolution while curbing deterioration of the distance measurement accuracy.

Other configurations, operations, and effects are the same as those of the above-described embodiments and thus detailed description thereof is omitted.

4. Fourth Embodiment

Although a case in which the positions of the DETs 22A and 22B in each light-receiving element 331 are, for example, positions near the center at the boundary of each light-receiving element 331 in the column direction (refer to FIG. 21) is exemplified in the third embodiment, the positions of the DETs 22A and 22B in each light-receiving element 331 may be modified in various manners.

Figure 26:
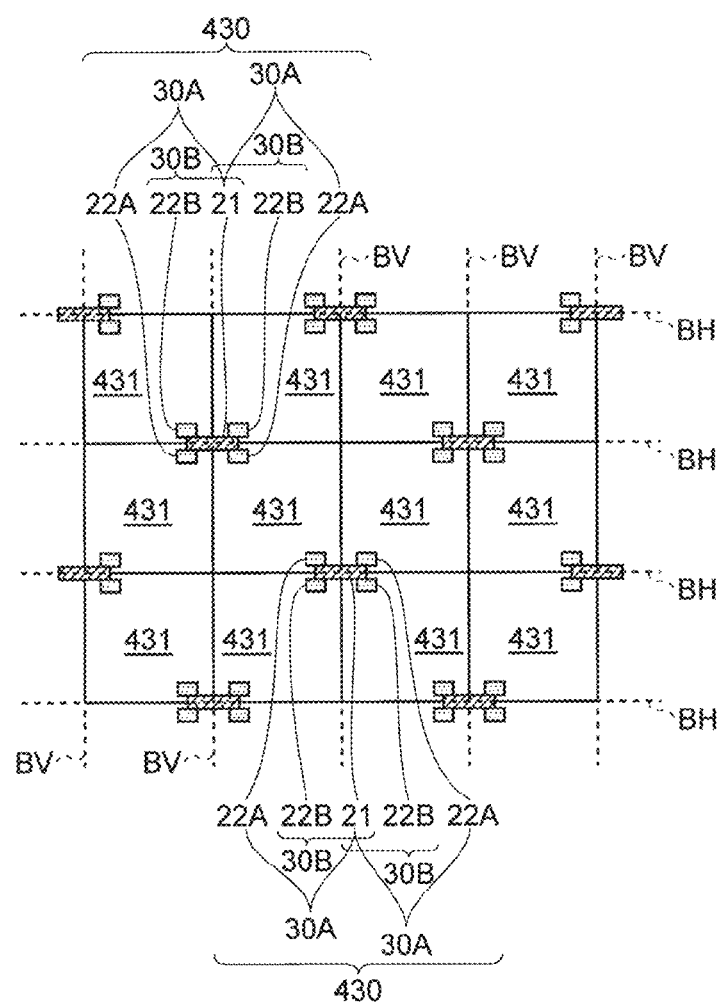
FIG. 26 is a plan view illustrating an example of a layout of light-receiving elements according to a fourth embodiment.

For example, by disposing DETs 22A and 22B in each light-receiving element 431 near corners at which MIXs 21 are provided, as illustrated in FIG. 26, charge moving to the MIX 21 to which the read voltage VmixA or VmixB is applied can be caused to efficiently gather in the DET 22A or 22B, and thus substantial quantum efficiency can be improved and contrast between pixels can be increased. Further, in the present embodiment, each PN semiconductor region 430 includes two signal extraction parts 30A and two signal extraction parts 30B like the PN semiconductor region 330 according to the third embodiment.

Figure 27:
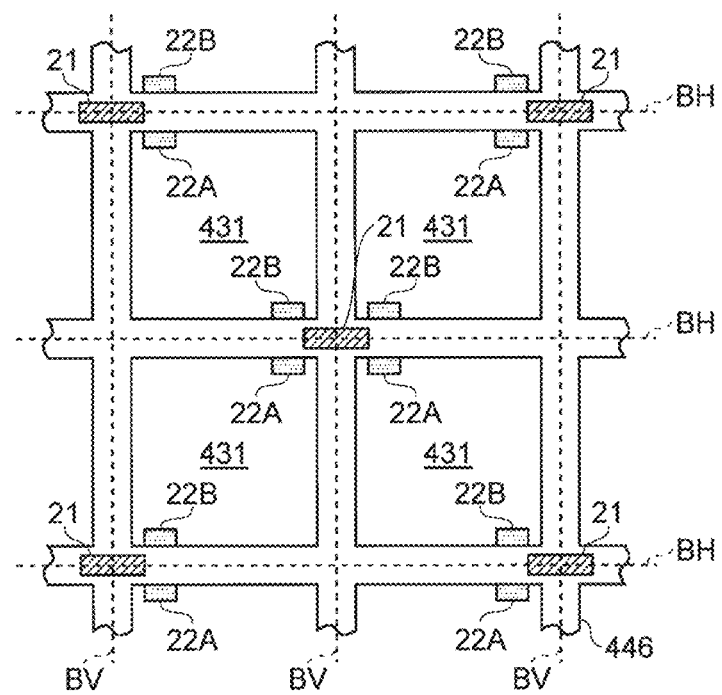
FIG. 27 is a diagram illustrating an example of a planar layout of pixel separating parts according to a fourth embodiment.
Figure 28:
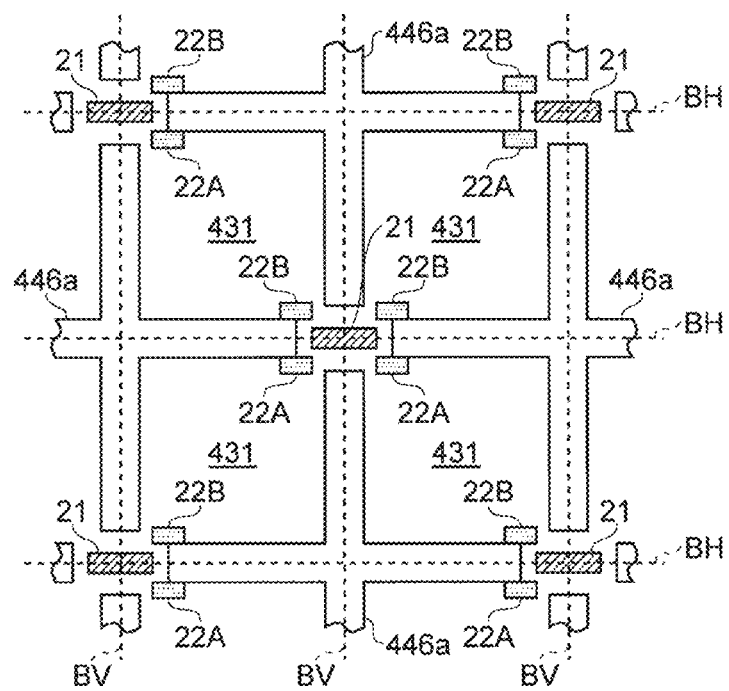
FIG. 28 is a diagram illustrating another example of a planar layout of the pixel separating parts according to the fourth embodiment.

In addition, pixel separating parts for optical separating between light-receiving elements 431 according to the fourth embodiment may be configured as pixel separating parts 446 having the same configuration as the pixel separating parts 346 according to the first example of the third embodiment, as illustrated in FIG. 27, or configured as pixel separating parts 446a having the same configuration as the pixel separating parts 346 according to the second example of the third embodiment, as illustrated in FIG. 28, for example.

Other configurations, operations, and effects are the same as those of the above-described embodiments and thus detailed description thereof is omitted.

5. Fifth Embodiment

Next, a fifth embodiment will be described below in detail with reference to the drawings. Meanwhile, redundant description will be omitted with respect to the same configurations, operations, and effects as those of the above-described embodiment by citing the above-described embodiment in the following description.

In the present embodiment, a case in which inflow of charge into the DET 22/22A or 22B is curbed and thus a quantity of current flowing at the time of reading is controlled to reduce power consumption in the above-described embodiments will be described. Meanwhile, although a case based on the first embodiment will be exemplified in the following description, an embodiment that is a basis is not limited to the first embodiment and may be other embodiments.

Figure 29:
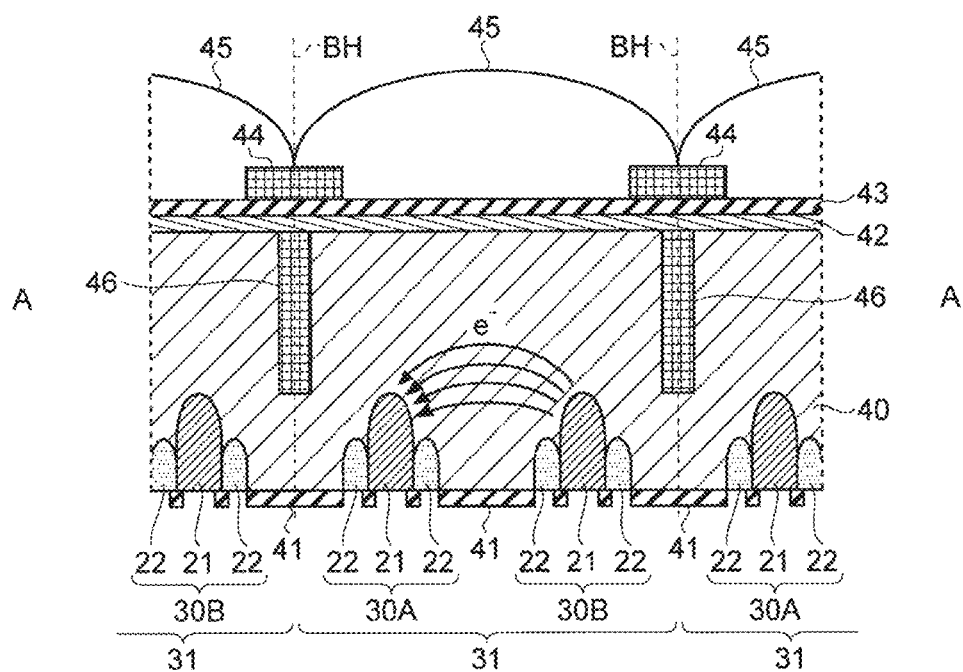
FIG. 29 is a diagram for describing movement of charges generated in a light-receiving element.

As illustrated in FIG. 29, when a positive read voltage VmixA for signal extraction is applied to the MIX 21 of the signal extraction part 30A and zero or a negative read voltage VmixB is applied to the signal extraction part 30B, for example, electrons (electrons) generated according to photoelectric conversion of light incident on the semiconductor substrate 40 are induced by electric fields formed in the light-receiving element 31 to move to the signal extraction part 30A and then flow into the DET 22 of the signal extraction part 30A.

At that time, although it is necessary to apply a high read voltage VmixA or VmixB in order to increase the quantum efficiency by forming strong electric fields in all light-receiving elements 31, when photoelectric conversion occurs near the signal extraction part 30A or 30B in such a case, a large amount of charge is generated near the signal extraction part 30A or 30B and thus excessive current may flow to increase power consumption.

Accordingly, in the present embodiment, generation of excessive current is curbed and increase in power consumption is reduced by hindering flow of charge generated near the signal extraction part 30A or 30B.

5.1 Configuration Example of Light-Receiving Element

Figure 30:
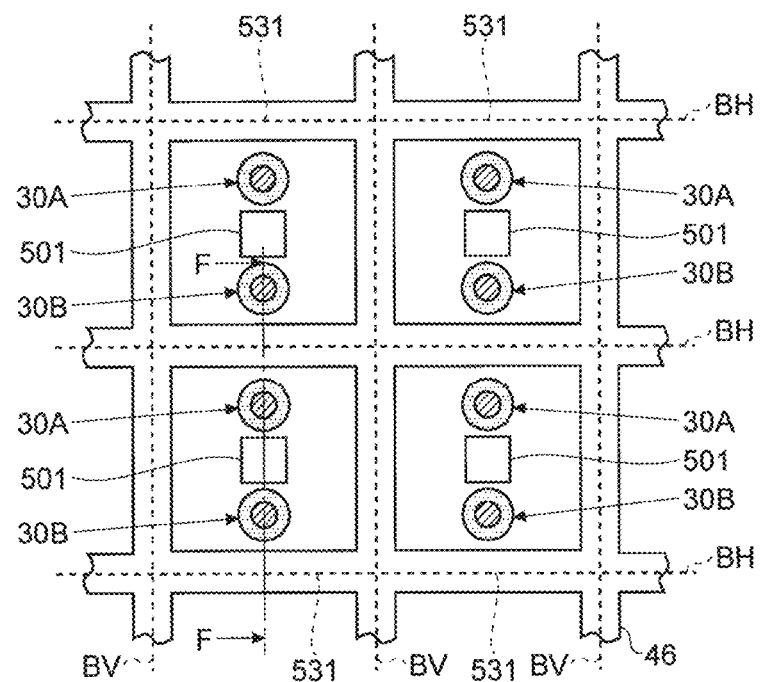
FIG. 30 is a plan view illustrating an example of a layout of light-receiving elements according to a fifth embodiment.
Figure 31:
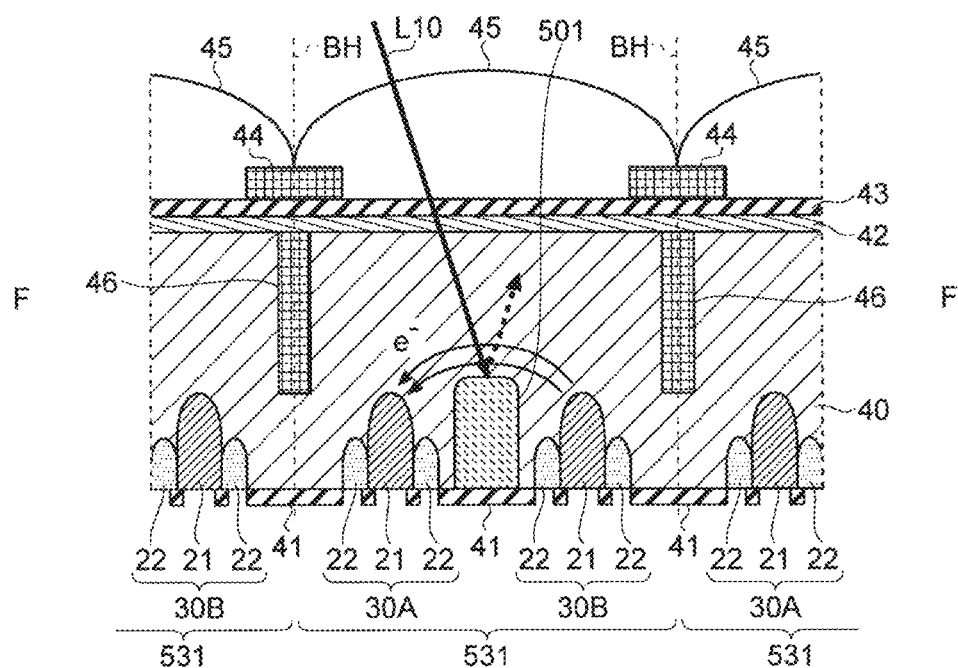
FIG. 31 is a cross-sectional view illustrating an example of a cross-sectional structure of plane F-F in FIG. 30.

FIG. 30 is a plan view illustrating an example of a layout of the light-receiving element according to the present embodiment. FIG. 31 is a cross-sectional view illustrating an example of a cross-sectional structure of plane F-F in FIG. 30.

As illustrated in FIG. 30 and FIG. 31, in each light-receiving element 531 according to the present embodiment, a blocking region 501 is provided between two signal extraction parts 30A and 30B, for example, in the same configuration as the light-receiving element 31 according to the first embodiment.

The blocking region 501 may be, for example, a structure formed using a material having a dielectric constant different from that of the semiconductor substrate 40, such as an insulating material such as silicon oxide ($SiO_2$), silicon nitride (SiN), or polysilicon (poly-Si), a reflective material that reflects light with a specific wavelength, such as tungsten (W), an absorbent material that absorbs light with a specific wavelength, or a high refractive material. However, the blocking region 501 is not limited thereto and may be various modified regions having high resistance by counter-doping an n-type dopant into a part of the region of the p-type well of the semiconductor substrate 40, and the like. In addition, when a conductive material such as tungsten (W) is used for the blocking region 501, an insulating layer may be provided around the blocking region 501 in order to electrically separate the blocking region 501 and the semiconductor substrate 40 from each other.

This blocking region 501 is a square columnar region protruding from the front surface (lower surface in the figure) to the back surface side (upper surface side in the figure) of the semiconductor substrate 40, for example, the height thereof (depth from the front surface of the semiconductor substrate 40) is greater than, for example, MIXs 21 in the two signal extraction parts 30A and 30B, and the width thereof in the row direction is greater than, for example, the MIXs 21 in the two signal extraction parts 30A and 30B. However, the blocking region 501 is not limited to these shape and dimensions and may at least be positioned at a region where the strength of electric fields formed between the signal extraction parts 30A and 30B is high.

5.2 Operation and Effects

As described above, when the blocking region 501 having a dielectric constant different from that of the semiconductor substrate 40 is formed between the signal extraction parts 30A and 30B, a potential distribution of electric fields formed by the two MIXs 21 in the light-receiving element 531 changes. Accordingly, movement of charge generated in a strong electric field region can be inhibited and a movement distance thereof can be increased, and thus generation of excessive current can be curbed and increase in power consumption can be reduced.

In addition, when a reflective material such as tungsten (W) or a high refractive index material is used for the blocking region 501, for example, the quantum efficiency of the light-receiving element 531 can be improved because incident light L10 reflected from the blocking region 501 also becomes an object of photoelectric conversion.

For the pixel separating parts 46, a light-shielding material such as tungsten (W) or a high refractive index material (e.g., a material having a refractive index higher than that of the semiconductor substrate 40) may be used.

5.3 Modified Examples of Blocking Region

In addition, although a case in which the blocking region 501 has a square columnar shape is exemplified in the present embodiment, the shape of the blocking region 501 is not limited thereto. Accordingly, some modified examples of the blocking regions will be exemplified below.

5.3.1 First Modified Example

Figure 32:
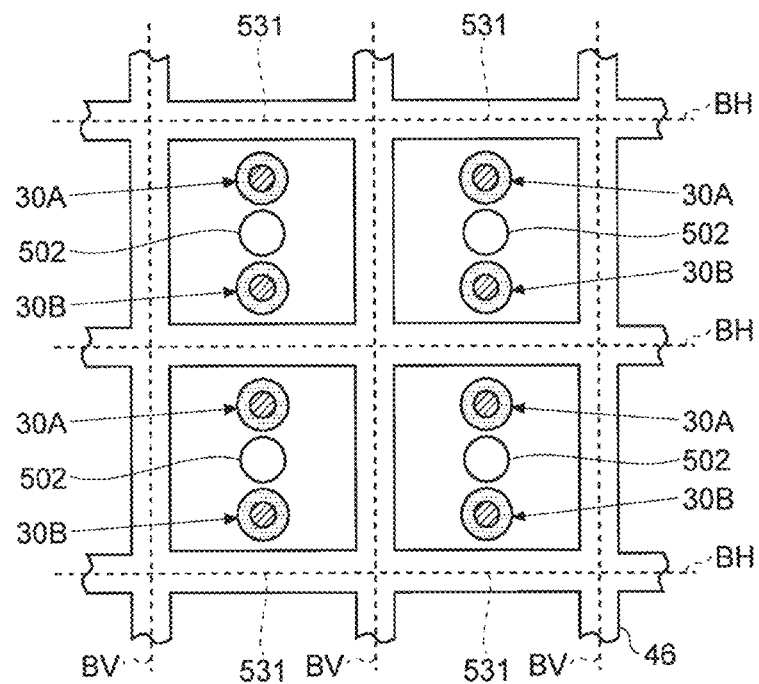
FIG. 32 is a plan view illustrating a configuration example of a blocking region according to a first modified example of the fifth embodiment.

FIG. 32 is a plan view illustrating a configuration example of a blocking region according to a first modified example. As illustrated in FIG. 32, a blocking region 502 may be, for example, a region having a cylindrical shape with a circular shape of a cross section parallel to the surface of the semiconductor substrate 40. However, the blocking region 502 is not limited to the cylindrical shape and may have an elliptic cylindrical shape, and the like.

5.3.2 Second Modified Example

Figure 33:
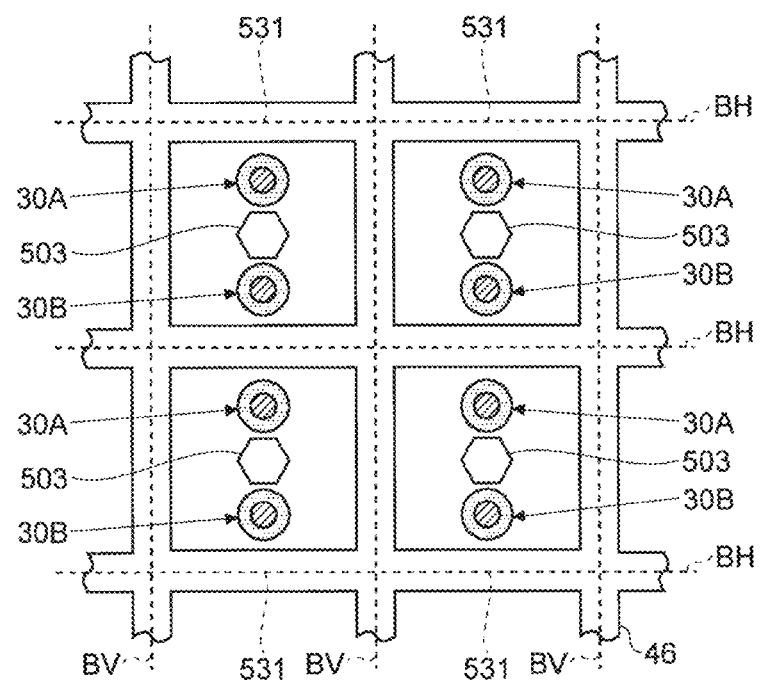
FIG. 33 is a plan view illustrating a configuration example of a blocking region according to a second modified example of the fifth embodiment.

FIG. 33 is a plan view illustrating a configuration example of a blocking region according to a second modified example. As illustrated in FIG. 33, a blocking region 503 may be, for example, a region having a polygonal column shape in which the shape of the cross section parallel to the surface of the semiconductor substrate 40 is a polygon such as a hexagon.

5.3.3 Third Modified Example

Figure 34:
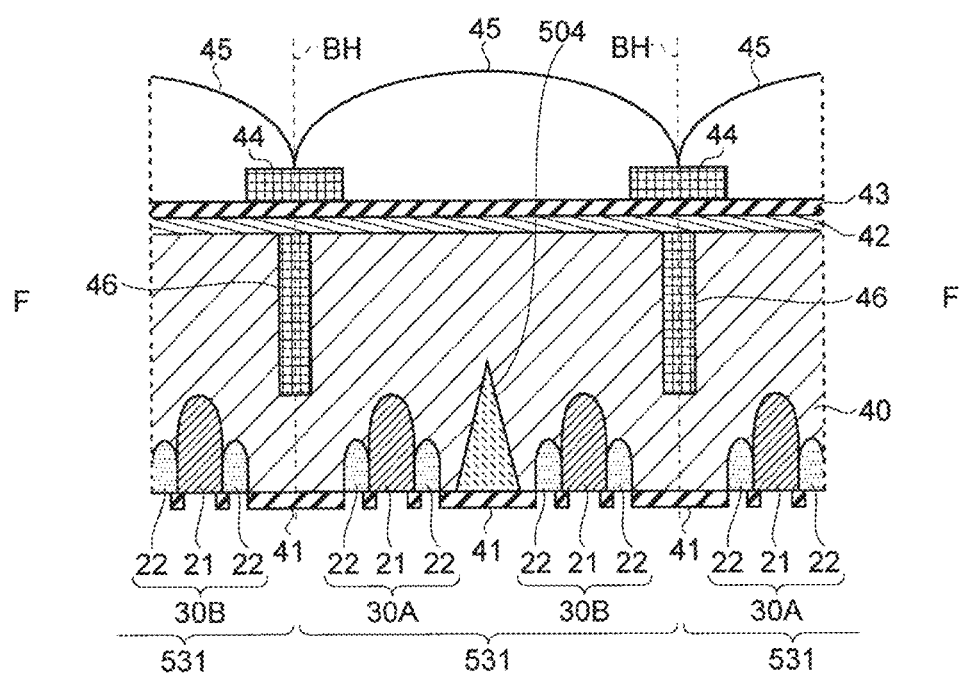
FIG. 34 is a plan view illustrating a configuration example of a blocking region according to a third modified example of the fifth embodiment.

FIG. 34 is a plan view illustrating a configuration example of a blocking region according to a third modified example. As illustrated in FIG. 34, a blocking region 504 may be, for example, a region having a conical shape with a triangular shape of a cross section perpendicular to the surface of the semiconductor substrate 40. Here, the shape of a cross section parallel to the surface of the semiconductor substrate 40 may be a circle (including an ellipse) or a polygon, as described above. In addition, the blocking region 504 is not limited to the conical shape and may have a truncated conical shape.

5.3.4 Fourth Modified Example

Figure 35:
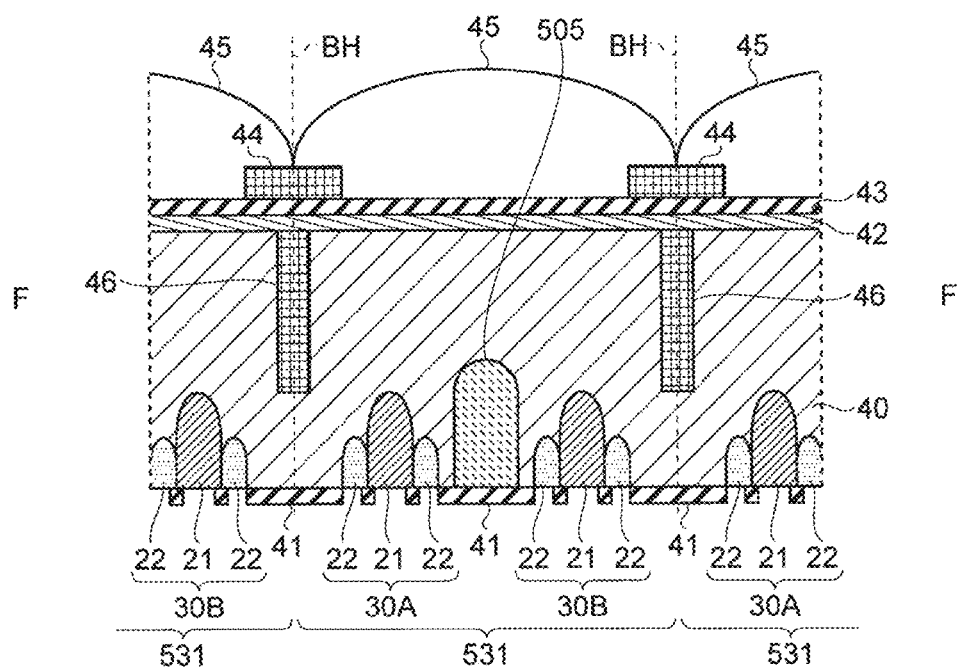
FIG. 35 is a plan view illustrating a configuration example of a blocking region according to a fourth modified example of the fifth embodiment.

FIG. 35 is a plan view illustrating a configuration example of a blocking region according to a fourth modified example. As illustrated in FIG. 35, the upper part of a blocking region 505 may have a dome shape with a curvature. Further, the shape other than the upper part may be various modified shapes such as a cylindrical shape and a truncated conical shape. In addition, the shape of a cross section parallel to the surface of the semiconductor substrate 40 may be a circle (including an ellipse) or a polygon, as described above.

By forming the blocking region 505 with the upper part having a curvature in this manner, light incident on the upper part of the blocking region 505 can be reflected to a wide range of the light-receiving element 531, and thus the quantum efficiency of the light-receiving element 531 can be improved.

5.3.5 Fifth Modified Example

Figure 36:
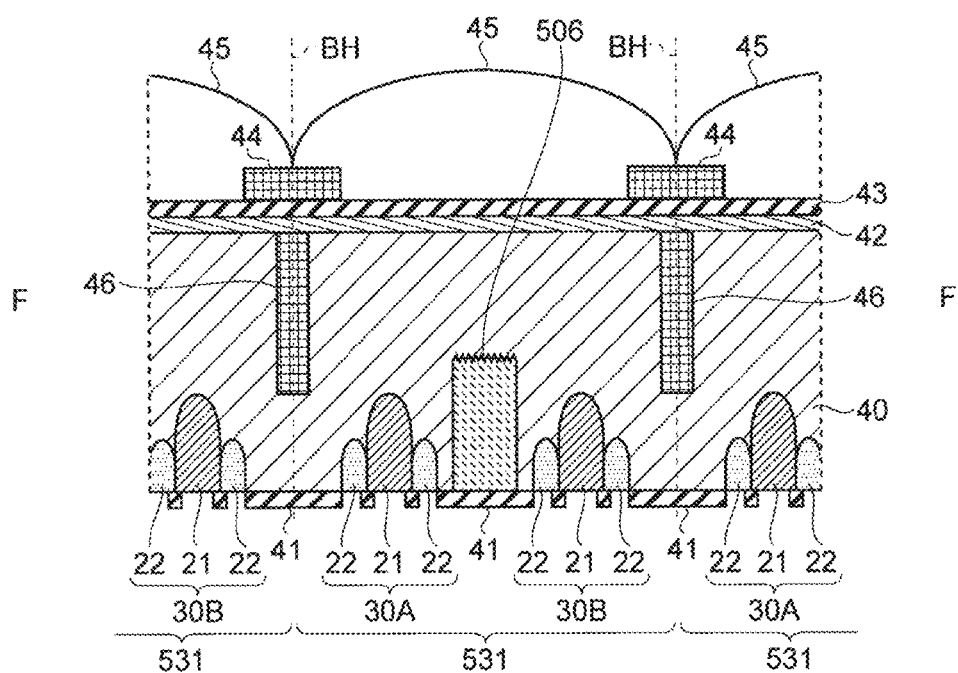
FIG. 36 is a plan view illustrating a configuration example of a blocking region according to a fifth modified example of the fifth embodiment.

FIG. 36 is a plan view illustrating a configuration example of a blocking region according to a fifth modified example. As illustrated in FIG. 36, the upper surface of a blocking region 506 may be roughened. Further, the shape other than the upper surface may be various modified shapes such as a cylindrical shape and a truncated conical shape. In addition, the shape of a cross section parallel to the surface of the semiconductor substrate 40 may be a circle (including an ellipse) or a polygon, as described above.

By roughening the upper surface of the blocking region 505 in this manner, light incident on the upper surface can be diffused-reflected to a wide range of the light-receiving element 531, and thus the quantum efficiency of the light-receiving element 531 can be improved.

6. Sixth Embodiment

Next, a sixth embodiment will be described below in detail with reference to the drawings. Meanwhile, redundant description will be omitted with respect to the same configurations, operations, and effects as those of the above-described embodiment by citing the above-described embodiment in the following description.

Although a case in which the blocking region 501 or the like is disposed between the two signal extraction parts 30A and 30B is exemplified in the above-described fifth embodiment, a position at which the blocking region is disposed is not limited thereto. Accordingly, some examples of a region where the blocking region is disposed and a shape thereof will be exemplified in the present embodiment.

6.1 First Example

Figure 37:
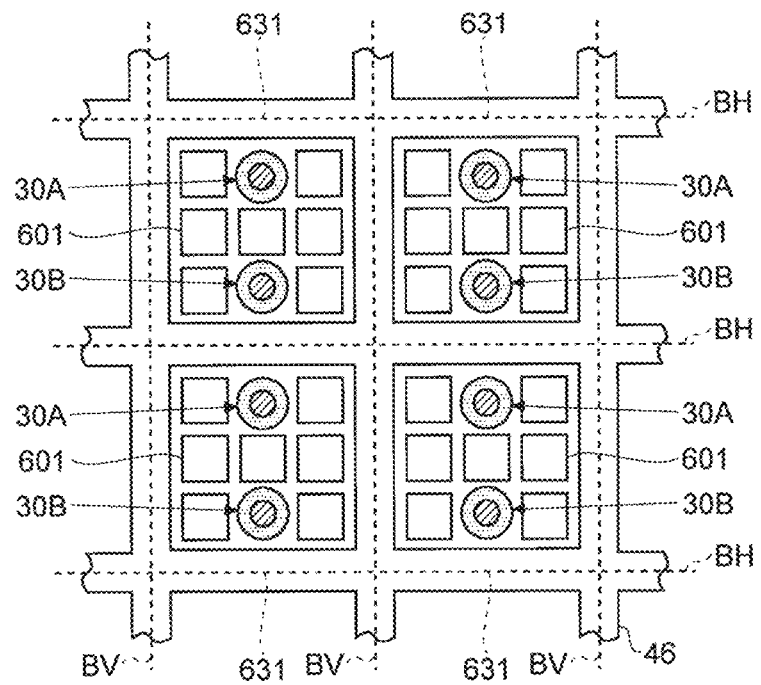
FIG. 37 is a plan view illustrating a configuration example of a blocking region according to a first example of a sixth embodiment.

FIG. 37 is a plan view illustrating a configuration example of a blocking region according to a first example. As illustrated in FIG. 37, for example, a blocking region 601 may be provided all over a light-receiving element 631 in addition to a region between two signal extraction parts 30A and 30B such that it protrudes from the front surface to the back surface side of the semiconductor substrate 40. That is, the blocking region 601 is also provided in parts other than the region between the two signal extraction parts 30A and 30B in each light-receiving element 631. Each blocking region 601 may be the same as the blocking region 501 and modified examples thereof according to the fifth embodiment, for example.

6.2 Second Example

Figure 38:
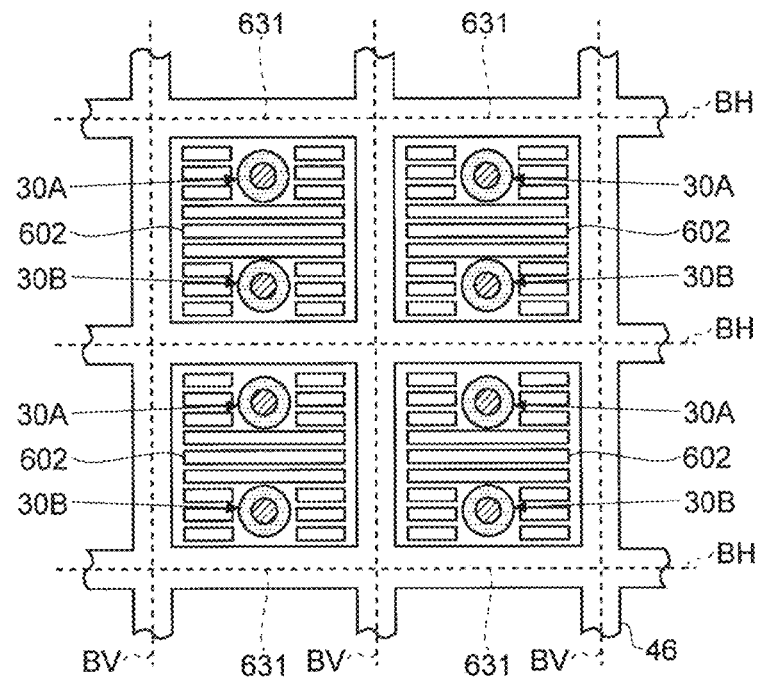
FIG. 38 is a plan view illustrating a configuration example of a blocking region according to a second example of the sixth embodiment.

FIG. 38 is a plan view illustrating a configuration example of a blocking region according to a second example. As illustrated in FIG. 38, a blocking region 602 may be a region including a plurality of rows extending in the row direction all over a light-receiving element 631 other than a region where two signal extraction parts 30A and 30B are present, for example.

6.3 Third Example

Figure 39:
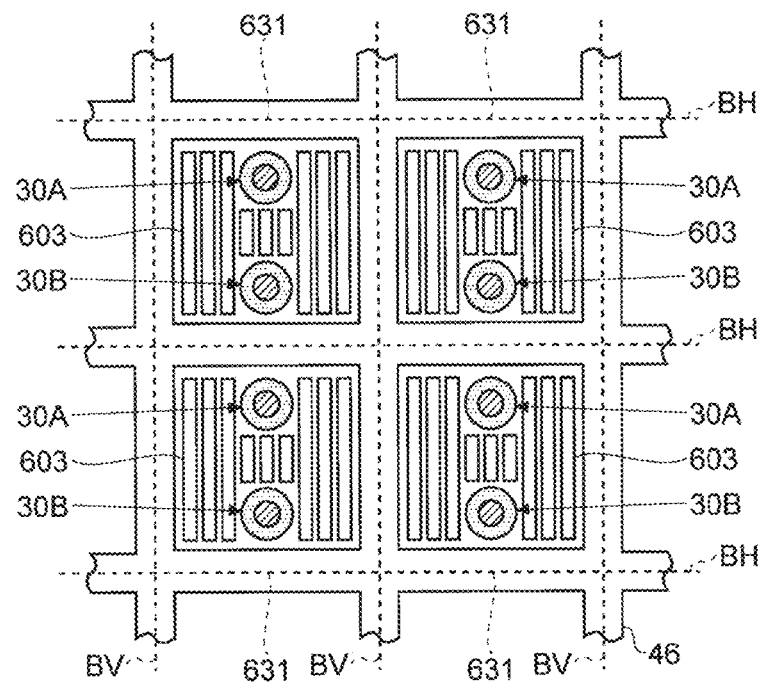
FIG. 39 is a plan view illustrating a configuration example of a blocking region according to a third example of the sixth embodiment.

FIG. 39 is a plan view illustrating a configuration example of a blocking region according to a third example. As illustrated in FIG. 39, a blocking region 603 may be a region including a plurality of columns extending in the column direction all over the light-receiving element 631 other than a region between two signal extraction parts 30A and 30B, for example.

6.4 Fourth Example

Figure 40:
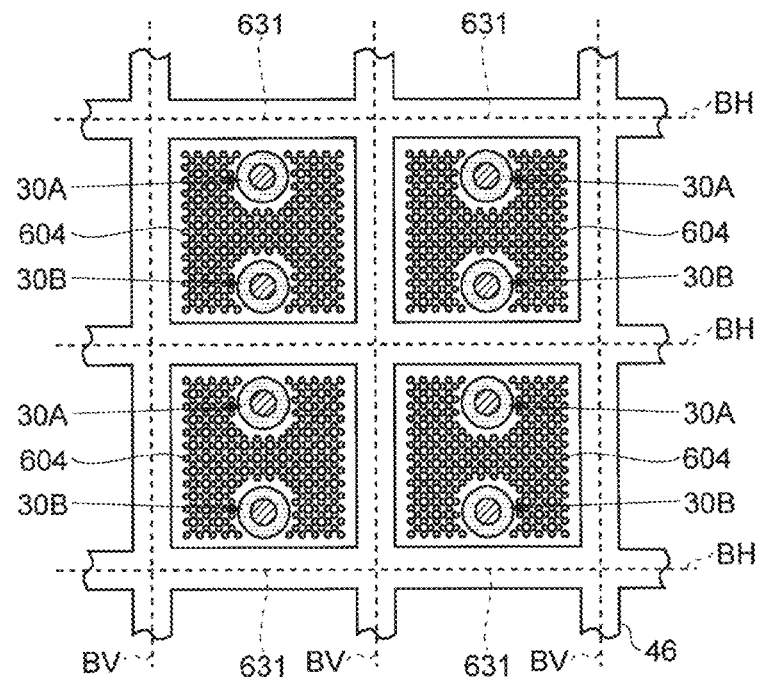
FIG. 40 is a plan view illustrating a configuration example of a blocking region according to a fourth example of the sixth embodiment.

FIG. 40 is a plan view illustrating a configuration example of a blocking region according to a fourth example. As illustrated in FIG. 40, a blocking region 604 may be a region in which fine convex regions are arranged regularly or randomly all over the light-receiving element 631 other than a region between two signal extraction parts 30A and 30B, for example. Further, the regular arrangement may include, for example, a square arrangement, a hexagonal dense arrangement, and the like. In addition, the random arrangement may include two or more distances between convex regions.

6.5 Operation and Effects

By providing the blocking regions 601 to 604 all over the light-receiving element 631, as described above, movement of charge can be inhibited in a region near the surface of the semiconductor substrate 40 in which strong electric fields are formed and photoelectric conversion easily occurs, and thus generation of excessive current can be curbed and increase in power consumption can be reduced.

Further, in the aforementioned first to fourth examples, the quantum efficiency of the light-receiving element 631 can be improved because incident light L10 reflected from the blocking region 601, 602, 603, or 604 positioned between the two signal extraction parts 30A and 30B can also become an object of photoelectric conversion by using a material that reflects the incident light L10, such as a reflective material or a high refractive index material, for the blocking region 601, 602, 603, or 604.

Other configurations, operations, and effects are the same as those of the above-described embodiments and thus detailed description thereof is omitted.

7. Seventh Embodiment

Figure 41:
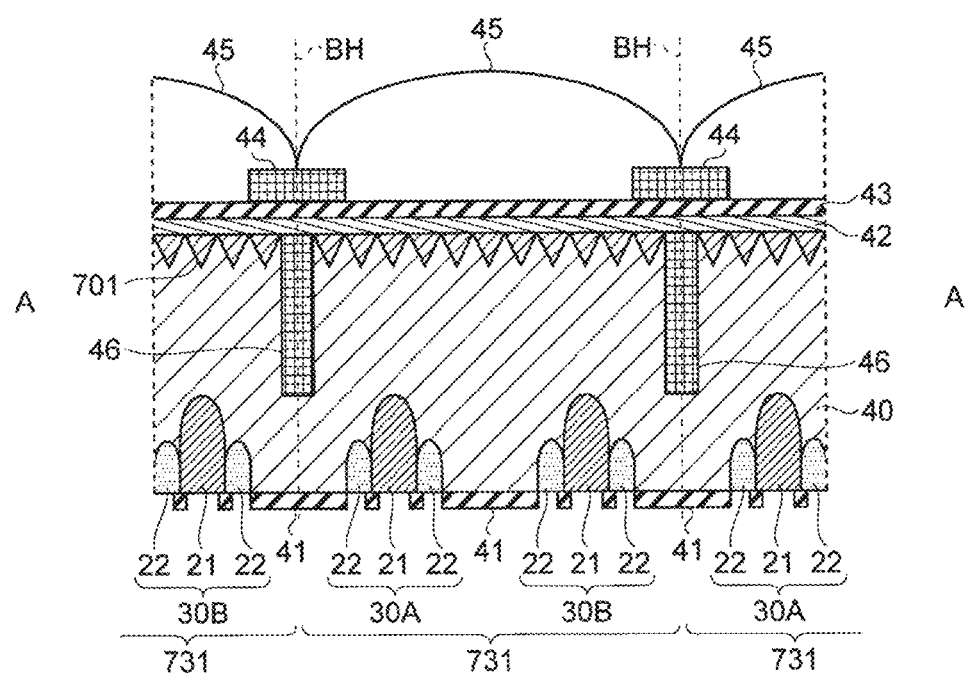
FIG. 41 is a cross-sectional view illustrating a schematic configuration example of a light-receiving element according to a seventh embodiment.

Furthermore, in the above-described embodiments, the light incident surface of the semiconductor substrate 40 may be formed in a moth-eye structure, for example, by providing grooves 701 in a conical shape, a quadrangular pyramid shape, or the like in the light incident surface of the semiconductor substrate 40, as illustrated in FIG. 41.

By forming the light incident surface of the semiconductor substrate 40 in a moth-eye structure in this manner, reflectivity on the light incident surface can be reduced such that a large amount of light can be incident on light-receiving elements 731, and thus substantial quantum efficiency can be improved and contrast between pixels can be increased.

Meanwhile, the shape of the grooves 701 is not limited to the conical shape and the quadrangular pyramid shape and the grooves 701 may have various modified shapes such as an elliptic cone, and a polygonal pyramid such as a triangular pyramid.

Other configurations, operations, and effects are the same as those of the above-described embodiments and thus detailed description thereof is omitted.

8. Application Examples

The technology according to the present disclosure can be applied to various products. For example, the technique according to the present disclosure may be realized as an apparatus to be mounted to any of types of mobile bodies including an automobile, an electric vehicle, a hybrid electric vehicle, a motorcycle, a bicycle, personal mobility, an airplane, a drone, an ocean vessel, a robot, a construction machine, an agricultural machine (tractor), and the like.

Figure 42:
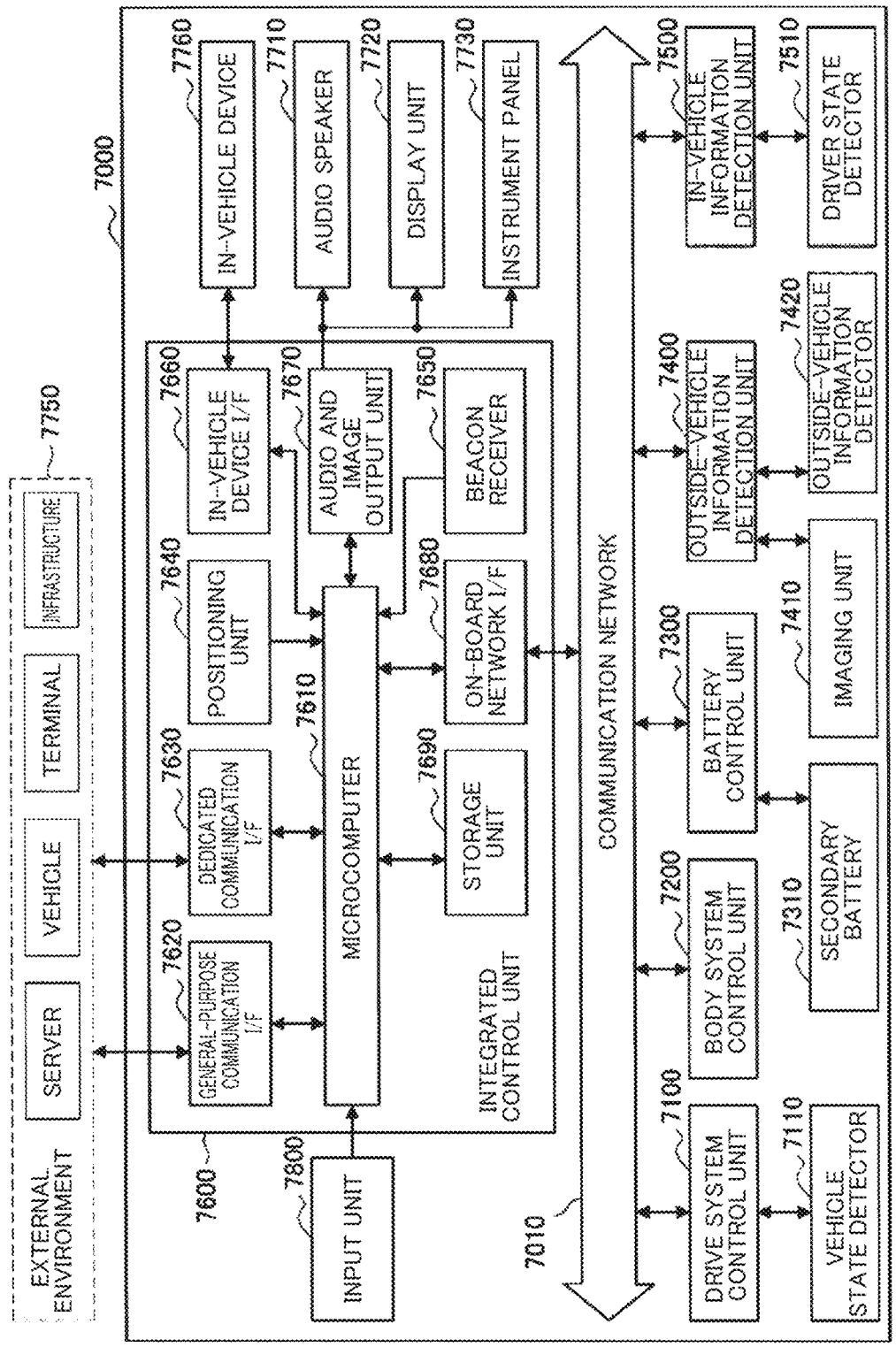
FIG. 42 is a block diagram illustrating an example of a schematic configuration of a vehicle control system.

FIG. 42 is a block diagram illustrating a schematic configuration example of a vehicle control system 7000 that is an example of a moving object control system to which the technology according to the present disclosure can be applied. The vehicle control system 7000 includes a plurality of electronic control units connected via a communication network 7010. In the example illustrated in FIG. 42, the vehicle control system 7000 includes a drive system control unit 7100, a body system control unit 7200, a battery control unit 7300, an outside-vehicle information detection unit 7400, an in-vehicle information detection unit 7500, and an integrated control unit 7600. The communication network 7010 connecting these plurality of control units may be, for example, an on-board communication network based on an arbitrary standard such as a controller area network (CAN), a local interconnect network (LIN), a local area network (LAN), or FlexRay (registered trademark).

Each control unit includes a microcomputer that performs arithmetic operation processing according to various programs, a storage unit that stores programs executed by the microcomputer, parameters used for various arithmetic operations, and the like, and a driving circuit that drives various devices that are control targets. Each control unit includes a network I/F for performing communication with other control units through the communication network 7010, and a communication I/F for performing communication with devices inside/outside a vehicle, sensors, or the like through wired communication or wireless communication. FIG. 42 illustrates a microcomputer 7610, a general-purpose communication I/F 7620, a dedicated communication I/F 7630, a positioning unit 7640, a beacon receiver 7650, an in-vehicle device I/F 7660, an audio and image output unit 7670, an on-board network I/F 7680, and a storage unit 7690 as functional components of the integrated control unit 7600. Likewise, other control units also include a microcomputer, a communication I/F, a storage unit, and the like.

The drive system control unit 7100 controls operations of devices related to a drive system of a vehicle in accordance with various programs. For example, the drive system control unit 7100 functions as a control device for a driving force generation device for generating a driving force of a vehicle such as an internal combustion engine or a drive motor, a driving force transmission mechanism for transmitting a driving force to wheels, a steering mechanism that adjusts a steering angle of a vehicle, a braking device that generates a braking force for a vehicle, etc. The drive system control unit 7100 may have a function as a control device, such as an antilock brake system (ABS) or electronic stability control (ESC).

A vehicle state detector 7110 is connected to the drive system control unit 7100. For example, the vehicle state detector 7110 includes a gyro sensor that detects an angular velocity of axial rotation movement of a vehicle body, an acceleration sensor that detects an acceleration of a vehicle, and at least one of sensors for detecting an operation amount of an accelerator pedal, an operation amount of a brake pedal, a steering angle of a steering wheel, an engine RPM, a rotation speed of vehicle wheels, and the like. The drive system control unit 7100 performs arithmetic operation processing using a signal input from the vehicle state detector 7110 and controls an internal combustion engine, a driving motor, an electrically controlled power steering device, a brake device, or the like.

The body system control unit 7200 controls operations of various devices mounted in a vehicle body according to various programs. For example, the body system control unit 7200 functions as a control device of a keyless entry system, a smart key system, a power window device, various lamps such as a head lamp, a back lamp, a brake lamp, a blinker, or a fog lamp, or the like. In this case, radio waves or signals of various switches transmitted from a portable device with which keys are replaced may be input to the body system control unit 7200. The body system control unit 7200 receives an input of the radio waves or signals and controls a door lock device, a power window device, lamps, and the like of the vehicle.

The battery control unit 7300 controls a secondary battery 7310 that is a power supply source of the driving motor according to various programs. For example, information such as a battery temperature, a battery output voltage, or a remaining battery capacity is input to the battery control unit 7300 from a battery device including the secondary battery 7310. The battery control unit 7300 performs arithmetic operation processing using these signals and controls temperature adjustment of the secondary battery 7310 and a cooling device and the like included in the battery device.

The outside-vehicle information detection unit 7400 detects information on the outside of the vehicle in which the vehicle control system 7000 is mounted. For example, at least one of an imaging unit 7410 and an outside-vehicle information detector 7420 is connected to the outside-vehicle information detection unit 7400. The imaging unit 7410 includes at least one of a time of flight (ToF) camera, a stereo camera, a monocular camera, an infrared camera, and other cameras. The outside-vehicle information detector 7420 includes, for example, at least one of an environment sensor for detecting current weather or weather conditions and a surrounding information detection sensor for detecting other vehicles, obstacles, pedestrians, or the like around the vehicle in which the vehicle control system 7000 is mounted.

For example, the environment sensor may be at least one of a raindrop sensor that detects rainy weather, a fog sensor that detects fog, a sunshine sensor that detects a degree of sunshine, and a snow sensor that detects snowfall. The surrounding information detection sensor may be at least one of an ultrasonic sensor, a radar device, and a light detection and ranging laser imaging detection and ranging (LIDAR) device. The imaging unit 7410 and the outside-vehicle information detector 7420 may be provided as independent sensors or devices or provided as a device in which a plurality of sensors or devices are integrated.

Figure 43:
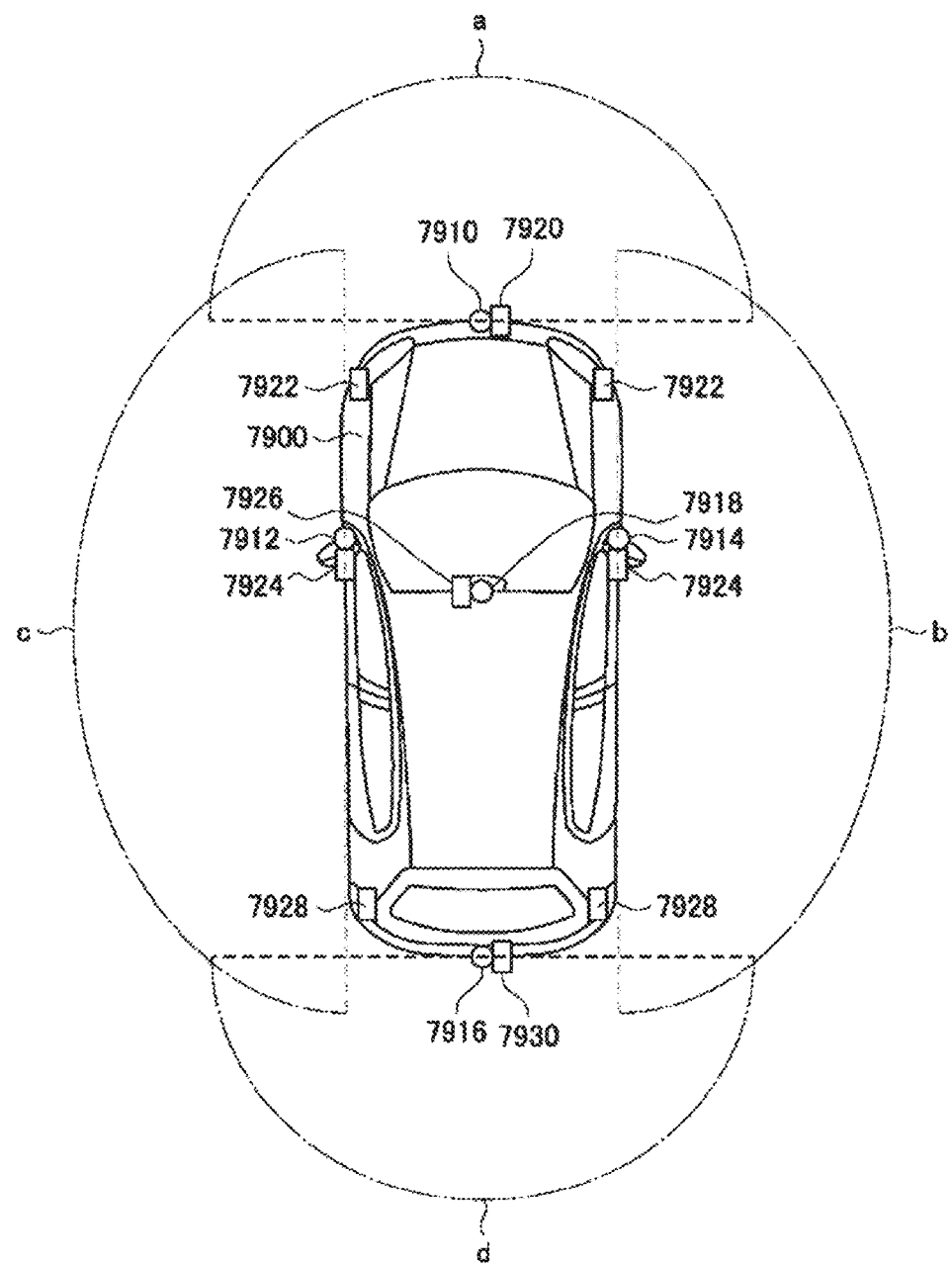
FIG. 43 is an explanatory diagram illustrating an example of installation positions of an outside-vehicle information detector and an imaging unit.

Here, FIG. 43 illustrates an example of installation positions of the imaging unit 7410 and the outside-vehicle information detector 7420. The imaging units 7910, 7912, 7914, 7916, and 7918 are provided at at least one of positions such as a front nose, side-view mirrors, a rear bumper, a back door, and an upper portion of a windshield in the vehicle cabin of a vehicle 7900. The imaging unit 7910 provided in the front nose and the imaging unit 7918 provided in the upper portion of the windshield in the vehicle cabin mainly acquire an image of a region in front of the vehicle 7900. The imaging units 7912 and 7914 included in the side-view mirrors mainly acquire images of the side of the vehicle 7900. The imaging unit 7916 included in the rear bumper or the back door mainly acquires an image of a region behind the vehicle 7900. The imaging unit 7918 provided on the upper portion of the windshield in the vehicle cabin is mainly used to detect a preceding vehicle, a pedestrian, an obstacle, a traffic signal, a traffic sign, a lane, or the like.

Further, FIG. 43 illustrates an example of imaging ranges of the imaging units 7910, 7912, 7914, and 7916. An imaging range a indicates an imaging range of the imaging unit 7910 provided in the front nose, an imaging ranges b and c indicate imaging ranges of the imaging units 7912 and 7914 provided in the respective side-view mirrors, and an imaging range d indicates an imaging range of the imaging unit 7916 provided in the rear bumper or the back door. For example, by image data captured by the imaging units 7910, 7912, 7914, and 7916 being superimposed, a bird's-eye view image of the vehicle 7900 viewed from above can be obtained.

Outside-vehicle information detectors 7920, 7922, 7924, 7926, 7928, and 7930 provided on the front, rear, sides, corners, and the upper portion of the windshield in the vehicle cabin of the vehicle 7900 may be ultrasonic sensors or radar devices, for example. The outside-vehicle information detectors 7920, 7926, and 7930 provided on the front nose, the rear bumper, the back door, and the upper portion of the windshield in the vehicle cabin of the vehicle 7900 may be LIDAR devices, for example. These outside-vehicle information detectors 7920 to 7930 are mainly used to detect a preceding vehicle, a pedestrian, an obstacle, or the like.

Description continues referring back to FIG. 42. The outside-vehicle information detection unit 7400 causes the imaging unit 7410 to capture an image of the outside of the vehicle and receives captured image data. In addition, the outside-vehicle information detection unit 7400 receives detection information from the outside-vehicle information detector 7420 connected thereto. When the outside-vehicle information detector 7420 is an ultrasonic sensor, a radar device, or a LIDAR device, the outside-vehicle information detection unit 7400 transmits ultrasonic waves, electromagnetic waves, or the like and receives information on received reflected waves. The outside-vehicle information detection unit 7400 may perform object detection processing or distance detection processing for people, vehicles, obstacles, signs, characters on a road surface, or the like on the basis of the received information. The outside-vehicle information detection unit 7400 may perform environment recognition processing for recognizing rainfall, fog, a road surface condition, or the like on the basis of the received information. The outside-vehicle information detection unit 7400 may calculate a distance to an object outside the vehicle on the basis of the received information.

The outside-vehicle information detection unit 7400 may perform image recognition processing or distance detection processing for recognizing people, vehicles, obstacles, signs, characters on a road surface, or the like on the basis of the received image data. The outside-vehicle information detection unit 7400 may perform processing such as distortion correction or alignment on the received image data and combine image data captured by different imaging units 7410 to generate a bird's eye image or a panorama image. The outside-vehicle information detection unit 7400 may perform viewpoint conversion processing using image data captured by different imaging units 7410.

The in-vehicle information detection unit 7500 detects in-vehicle information. A driver state detector 7510 that detects a state of a driver, for example, is connected to the in-vehicle information detection unit 7500. The driver state detector 7510 may include a camera that captures an image of the driver, a biosensor that detects biometric information on the driver, a microphone that collects sounds in the vehicle cabin, or the like. The biosensor is provided, for example, on the surface of a seat, the steering wheel, or the like and detects biometric information on a passenger sitting on the seat or the driver gripping the steering wheel. The in-vehicle information detection unit 7500 may calculate a degree of fatigue or a degree of concentration of the driver on the basis of the detection information input from the driver state detector 7510 or may determine whether or not the driver is asleep. The in-vehicle information detection unit 7500 may perform processing such as noise canceling processing on collected audio signals.

The integrated control unit 7600 controls overall operation in the vehicle control system 7000 according to various programs. An input unit 7800 is connected to the integrated control unit 7600. The input unit 7800 is realized by, for example, a device through which a passenger can perform input operation, such as a touch panel, a button, a microphone, a switch, or a lever. Data obtained by recognizing an audio input through the microphone may be input to the integrated control unit 7600. The input unit 7800 may be, for example, a remote control device using infrared rays or other radio waves, or an external connection device in response to an operation of the vehicle control system 7000, such as a cellular phone or a personal digital assistance (PDA). The input unit 7800 may be a camera, for example, and in this case, a passenger can input information through a gesture. Alternatively, data obtained by detecting a motion of a wearable device worn by a passenger may be input. Further, the input unit 7800 may include, for example, an input control circuit or the like which generates an input signal on the basis of information input by a passenger or the like using the input unit 7800 and outputs the input signal to the integrated control unit 7600. The passenger or the like inputs various types of data to the vehicle control system 7000 or instructs a processing operation by operating the input unit 7800.

The storage unit 7690 may include a read only memory (ROM) that stores various programs executed by the microcomputer and a random access memory (RAM) that stores various parameters, arithmetic operation results, sensor values, and the like. In addition, the storage unit 7690 may be realized by a magnetic storage device such as a hard disc drive (HDD), a semiconductor storage device, an optical storage device, a magneto-optic storage device, or the like.

The general-purpose communication I/F 7620 is a universal communication I/F that mediates communication with various devices present in an external environment 7750. The general-purpose communication I/F 7620 may be equipped with a cellular communication protocol such as Global System of Mobile communication (GSM) (registered trademark), WiMAX (registered trademark), Long Term Evolution (LTE) (registered trademark), or LTE-Advanced (LTE-A), or other wireless communication protocols such as wireless LAN (also called Wi-Fi (registered trademark)) and Bluetooth (registered trademark). The general-purpose communication I/F 7620 may be connected to an apparatus (e.g., an application server or a control server) present on an external network (e.g., the Internet, a cloud network, or a communication common carrier's own network) through a base station or an access point, for example. In addition, the general-purpose communication I/F 7620 may be connected to a terminal (e.g., a terminal of a driver, a pedestrian, or a store, or a machine type communication (MTC) terminal) present near the vehicle, for example, using Peer To Peer (P2P) technology.

The dedicated communication I/F 7630 is a communication I/F that supports a communication protocol established to be used in the vehicle. For example, the dedicated communication I/F 7630 may be equipped with a standard protocol such as wireless access in vehicle environment (WAVE), which is a combination of lower layer IEEE 802.11p and upper layer IEEE 1609, dedicated short range communications (DSRCs), or a cellular communication protocol. The dedicated communication I/F 7630 typically performs V2X communication that is a concept including at least one of vehicle-to-vehicle communication, vehicle-to-infrastructure communication, vehicle-to-home communication, and vehicle-to-pedestrian communication.

The positioning unit 7640 executes positioning by receiving a global navigation satellite system (GNSS) signal (e.g., a global positioning system (GPS) signal from a GPS satellite) from a GNSS satellite, for example, and generates position information including the latitude, longitude, and height of the vehicle. Further, the positioning unit 7640 may identify a current position through signal exchange with a wireless access point or acquire position information from a terminal having a positioning function, such as a cellular phone, a PHS, or a smartphone.

The beacon receiver 7650 receives radio waves or electromagnetic waves transmitted from a radio station installed on a road, for example, and acquires information such as a current position, congestion, road blocked, or time required. Further, the function of the beacon receiver 7650 may be included in the aforementioned dedicated communication I/F 7630.

The in-vehicle device I/F 7660 is a communication interface that mediates connection between the microcomputer 7610 and various in-vehicle devices 7760 present in the vehicle. The in-vehicle device I/F 7660 may establish wireless connection using a wireless communication protocol such as a wireless LAN, Bluetooth (registered trademark), Near Field Communication (NFC), or Wireless USB (WUSB). In addition, the in-vehicle device I/F 7660 may establish wired connection such as a universal serial bus (USB), High-Definition Multimedia Interface (HDMI) (registered trademark), or Mobile High-definition Link (MHL) through a connection terminal (and a cable as necessary) which is not illustrated. The in-vehicle devices 7760 may include, for example, at least one of a mobile device or a wearable device carried by a passenger and an information device carried into the vehicle or attached to the vehicle. In addition, the in-vehicle devices 7760 may include a navigation device that searches for a route to an arbitrary destination. The in-vehicle device I/F 7660 exchanges control signals or data signals between these in-vehicle devices 7760.

The on-board network I/F 7680 is an interface that mediates communication between the microcomputer 7610 and the communication network 7010. The on-board network I/F 7680 transmits and receives signals and the like according to a predetermined protocol supported by the communication network 7010.

The microcomputer 7610 of the integrated control unit 7600 controls the vehicle control system 7000 according to various programs on the basis of information acquired through at least one of the general-purpose communication I/F 7620, the dedicated communication I/F 7630, the positioning unit 7640, the beacon receiver 7650, the in-vehicle device I/F 7660, and the on-board network I/F 7680. For example, the microcomputer 7610 may calculate a control target value of a driving force generation device, a steering mechanism, or a braking device on the basis of acquired information on the inside or the outside of the vehicle, and output a control command to the drive system control unit 7100. For example, the microcomputer 7610 may perform cooperative control aiming at realizing functions of advanced driver assistance system (ADAS) including vehicle collision avoidance or impact mitigation, follow-up traveling based on an inter-vehicle distance, vehicle speed maintenance traveling, vehicle collision warning, vehicle lane deviation warning, and the like. Further, the microcomputer 7610 may control the driving force generation device, the steering mechanism, the braking device, or the like on the basis of acquired information on the vicinity of the vehicle to perform cooperative control aiming at autonomous driving in which the vehicle autonomously travels without depending on an operation of the driver.

The microcomputer 7610 may generate three-dimensional distance information on a distance between the vehicle and an object such as a surrounding structure or a person on the basis of information acquired through at least one of the general-purpose communication I/F 7620, the dedicated communication I/F 7630, the positioning unit 7640, the beacon receiver 7650, the in-vehicle device I/F 7660, and the on-board network I/F 7680 and create local map information including surrounding information on a current position of the vehicle. In addition, the microcomputer 7610 may predict a risk such as collision of the vehicle, approaching of a pedestrian or the like, or entry into a blocked road on the basis of the acquired information, and generate a signal for warning. The signal for warning may be, for example, a signal for generating warning sound or turning on warning lamp.

The audio and image output unit 7670 transmits an output signal of at least one of an audio and an image to an output device capable of visually or audibly notifying a passenger of the vehicle or the outside of the vehicle of information. In the example of FIG. 42, examples of the output device include an audio speaker 7710, a display unit 7720, and an instrument panel 7730. The display unit 7720 may include, for example, at least one of an on-board display and a head-up display. The display unit 7720 may have an augmented reality (AR) display function. The output device may be a device other than the aforementioned devices, such as a headphone, a wearable device worn by a passenger, such as a glasses-type display, a projector, or a lamp. When the output device is a display device, the display device visually displays results obtained according to various types of processing performed by the microcomputer 7610 or information received from other control units in various formats such as text, an image, a table, and a graph. In addition, when the output device is an audio output device, the audio output device converts an audio signal including reproduced audio data, acoustic data, or the like into an analog signal and audibly outputs the analog signal.

Further, in the example illustrated in FIG. 42, at least two control units connected through the communication network 7010 may be integrated into one control unit. Alternatively, an individual control unit may be configured as a plurality of control units. Further, the vehicle control system 7000 may include an additional control unit which is not illustrated. In addition, in the aforementioned description, some or all functions of any control unit may be executed by another control unit. That is, if transmission and reception of information are performed through the communication network 7010, predetermined arithmetic operation processing may be performed by any control unit. Likewise, a sensor or a device connected to any control unit may be connected to another control unit, and a plurality of control units may transmit/receive detection information to/from each other through the communication network 7010.

Further, a computer program for realizing each function of the ToF sensor 1 according to the present embodiment described using FIG. 1 can be implemented in any control unit or the like. In addition, a computer readable recording medium in which this computer program is stored can be provided. The recording medium may be, for example, a magnetic disk, an optical disk, a magneto-optic disk, a flash memory, or the like. Further, the aforementioned computer program may be distributed, for example, through a network without using the recording medium.

In the above-described vehicle control system 7000, the ToF sensor 1 according to the present embodiment described using FIG. 1 can be applied to the integrated control unit 7600 in the application example illustrated in FIG. 42. For example, the control unit 11, the arithmetic operation unit 15, and the external I/F 19 of the ToF sensor 1 correspond to the microcomputer 7610, the storage unit 7690, and the on-board network I/F 7680 of the integrated control unit 7600. However, the present disclosure is not limited thereto, and the vehicle control system 7000 may correspond to the host 80 in FIG. 1.

In addition, at least some components of the ToF sensor 1 according to the present embodiment described using FIG. 1 may be realized in a module (e.g., an integrated circuit module configured using a single die) for the integrated control unit 7600 illustrated in FIG. 42. Alternatively, the ToF sensor 1 according to the present embodiment described using FIG. 1 may be realized by a plurality of control units of the vehicle control system 7000 illustrated in FIG. 42.

Although the embodiments of the present disclosure have been described above, the technical scope of the present disclosure is not limited to the above-described embodiments and can be modified in various manners without departing from essential characteristics of the present disclosure. In addition, components in different embodiments and modified examples may be appropriately combined.

In addition, the effects in each embodiment described in the present description are merely illustrative and not restrictive, and other effects may be obtained.

Meanwhile, the present technology may also have the following configuration.

(1)

A light-receiving element including: a semiconductor substrate; and lattice-shaped pixel separating parts that divide the semiconductor substrate into a plurality of pixel regions arranged in a matrix form, wherein each of the pixel regions includes:

a first semiconductor region disposed on a first surface side in the semiconductor substrate;

a second semiconductor region disposed on the first surface side in the semiconductor substrate separately from the first semiconductor region; and a first blocking region disposed between the first semiconductor region and the second semiconductor region on the first surface side in the semiconductor substrate and having a dielectric constant different from that of the semiconductor substrate.

(2)

The light-receiving element according to (1), wherein a height of the first blocking region from the first surface is greater than heights of the first and second semiconductor regions from the first surface.

(3)

The light-receiving element according to (1) or (2), wherein a cross section of the first blocking region parallel to the first surface has a circular shape, an elliptic shape, or a polygonal shape.

(4)

The light-receiving element according to any one of (1) to (3), wherein the first blocking region has a column shape, a conical shape, or a truncated conical shape.

(5)

The light-receiving element according to any one of (1) to (4), wherein an upper part of the first blocking region on the opposite side of the first surface has a curvature.

(6)

The light-receiving element according to any one of (1) to (5), wherein an upper surface of the first blocking region on the opposite side of the first surface is roughened.

(7)

The light-receiving element according to any one of (1) to (6), wherein a material of the first blocking region includes at least one of an insulating material, a material that reflects or absorbs light with a specific wavelength, and a high refractive index material.

(8)

The light-receiving element according to any one of (1) to (7), further including one or more second blocking regions disposed in a region other than a region between the first semiconductor region and the second semiconductor region on the first surface side in the semiconductor substrate.

(9)

The light-receiving element according to (8), wherein the first and second blocking regions are regions including a plurality of rows extended in a row direction or regions including a plurality of columns extending in a column direction.

(10)

The light-receiving element according to (8), wherein the first and second blocking regions are regions in which a plurality of convex regions are arranged regularly or randomly.

(11)

The light-receiving element according to any one of (8) to (10), wherein a material of the first blocking region is a reflective material or a high refractive index material.

(12)

The light-receiving element according to any one of (8) to (11), wherein a material of the second blocking regions includes at least one of an insulating material, a material that reflects or absorbs light with a specific wavelength, and a high refractive index material.

(13)

The light-receiving element according to any one of (1) to (12), wherein the pixel separating parts protrude from a second surface opposite the first surface in the semiconductor substrate to the first surface or protrude from the first surface of the semiconductor substrate to a second surface.

(14)

The light-receiving element according to any one of (1) to (12), wherein the pixel separating parts penetrate from the first surface of the semiconductor substrate to the second surface opposite the first surface.

(15)
The light-receiving element according to any one of (1) to (14), wherein each of the first and second semiconductor regions includes a third semiconductor region positioned at a boundary between the pixel regions, and two fourth semiconductor regions adjacent to the third semiconductor region having the boundary interposed between the two fourth semiconductor regions, and the third semiconductor region is shared by the two pixel regions forming the boundary.

(16)
The light-receiving element according to (15), wherein the pixel separating parts are cut off at parts intersecting the first and second semiconductor regions.

(17)
The light-receiving element according to any one of (1) to (14), wherein each of the first and second semiconductor regions includes a third semiconductor region positioned at a part where corners of four pixel regions meet, and fourth semiconductor regions respectively positioned in two regions having a boundary formed by two adjacent pixel regions among the four pixel regions and interposed between the two regions, and the third semiconductor region is shared by the two pixel regions.

(18)
The light-receiving element according to (17), wherein the pixel separating parts are cut off at the part where the corners of the four pixel regions meet.

(19)
A solid-state imaging device including: a semiconductor substrate; and lattice-shaped pixel separating parts that divide the semiconductor substrate into a plurality of pixel regions arranged in a matrix form,
wherein
each of the pixel regions includes:
a first semiconductor region disposed on a first surface side in the semiconductor substrate;
a second semiconductor region disposed on the first surface side in the semiconductor substrate separately from the first semiconductor region; and
a first blocking region disposed between the first semiconductor region and the second semiconductor region on the first surface side in the semiconductor substrate and having a dielectric constant different from that of the semiconductor substrate, and
wherein the solid-state imaging device further includes:
a first read circuit connected to the first semiconductor region; and
a second read circuit connected to the second semiconductor region.

(20)
A distance measurement device including: a light-emitting unit that projects light with a predetermined wavelength;
a solid-state imaging device that generates a pixel signal from received light; and
an arithmetic operation unit that calculates a distance to an object on the basis of the pixel signal generated by the solid-state imaging device,
wherein
the solid-state imaging device including:
a semiconductor substrate; and
lattice-shaped pixel separating parts that divide the semiconductor substrate into a plurality of pixel regions arranged in a matrix form,
wherein
each of the pixel regions includes:
a first semiconductor region disposed on a first surface side in the semiconductor substrate;
a second semiconductor region disposed on the first surface side in the semiconductor substrate separately from the first semiconductor region; and
a first blocking region disposed between the first semiconductor region and the second semiconductor region on the first surface side in the semiconductor substrate and having a dielectric constant different from that of the semiconductor substrate, and
wherein
the solid-state imaging device further includes:
a first read circuit connected to the first semiconductor region; and
a second read circuit connected to the second semiconductor region.

REFERENCE SIGNS LIST

1 ToF sensor
11 Control unit
13 Light-emitting unit
14 Light-receiving unit
15 Arithmetic operation unit
19 External I/F
20 Unit pixel
20A, 20B Read circuit
21 p+ semiconductor region (MIX)
22, 22A, 22B n+ semiconductor region (DET)
23 Reset transistor
24 Transfer transistor
26 FD
27 Amplification transistor
28 Select transistor
29A, 29B Constant current circuit
30A, 30B Signal extraction part
31, 231, 331, 431, 531, 631, 731 Light-receiving element
40 Semiconductor substrate
41 Insulating layer
42 Antireflection film
43 Planarization film
44 Light-shielding film
45 On-chip lens
46, 46a, 46b, 246, 246a, 246b, 346, 346a, 446, 446a Pixel separating part
50 Laminated chip
51 Light-receiving chip
52 Circuit chip
80 Host
90 Object
100 Solid-state imaging device
101 Pixel array unit
102 System control unit
103 Vertical driving circuit
104 Column processing circuit
105 Horizontal driving circuit
106 Signal processing unit
107 Data storage unit
230, 330, 430 PN semiconductor region
501, 502, 503, 504, 505, 506, 601, 602, 603, 604 Blocking region
701 Groove
BH, BV Boundary
L1 Laser light
L2, L11 Reflected light L10 Incident light
LD Pixel driving line
VSL, VSL0, VSL1 Vertical signal line

What is claimed is:

1. A light-receiving element, comprising:
a semiconductor substrate; and
lattice-shaped pixel separating parts that divide the semiconductor substrate into a plurality of pixel regions arranged in a matrix form,
wherein each of the pixel regions includes:
a first semiconductor region disposed on a first surface in the semiconductor substrate;
a second semiconductor region disposed on the first surface in the semiconductor substrate separately from the first semiconductor region; and
a first blocking region disposed between the first semiconductor region and the second semiconductor region on the first surface in the semiconductor substrate and having a dielectric constant different from that of the semiconductor substrate,
wherein the first blocking region has a conical shape or a truncated conical shape, and
wherein the first semiconductor region includes a third semiconductor region positioned at a boundary between the pixel regions of the plurality of pixel regions, the second semiconductor region includes two fourth semiconductor regions adjacent to the third semiconductor region having the boundary interposed between the third semiconductor region and the two fourth semiconductor regions, and the third semiconductor region is shared by two pixel regions of the plurality of pixel regions forming the boundary.

2. The light-receiving element according to claim 1, wherein a height of the first blocking region from the first surface is greater than heights of the first and second semiconductor regions from the first surface.

3. The light-receiving element according to claim 1, wherein a cross section of the first blocking region parallel to the first surface has a circular shape or an elliptic shape.

4. The light-receiving element according to claim 1, wherein an upper part of the first blocking region on an opposite side of the first surface has a curvature.

5. The light-receiving element according to claim 1, wherein an upper surface of the first blocking region on an opposite side of the first surface is roughened.

6. The light-receiving element according to claim 1, wherein a material of the first blocking region includes at least one of an insulating material, a material that reflects or absorbs light with a specific wavelength, and a material having a refractive index greater than a refractive index of the semiconductor substrate.

7. The light-receiving element according to claim 1, further including one or more second blocking regions disposed in a region other than a region between the first semiconductor region and the second semiconductor region on the first surface in the semiconductor substrate.

8. The light-receiving element according to claim 7, wherein the first and the one or more second blocking regions are regions including a plurality of rows extending in a row direction or regions including a plurality of columns extending in a column direction.

9. The light-receiving element according to claim 7, wherein the first and the one or more second blocking regions are regions in which a plurality of convex regions are arranged regularly or randomly.

10. The light-receiving element according to claim 7, wherein a material of the first blocking region is a reflective material or a material having a refractive index greater than a refractive index of the semiconductor substrate.

11. The light-receiving element according to claim 7, wherein a material of the second blocking regions includes at least one of an insulating material, a material that reflects or absorbs light with a specific wavelength, and a material having a refractive index greater than a refractive index of the semiconductor substrate.

12. The light-receiving element according to claim 1, wherein the pixel separating parts protrude from a second surface opposite the first surface in the semiconductor substrate to the first surface or protrude from the first surface of the semiconductor substrate to the second surface.

13. The light-receiving element according to claim 1, wherein the pixel separating parts penetrate from the first surface of the semiconductor substrate to a second surface opposite the first surface.

14. The light-receiving element according to claim 1, wherein the pixel separating parts are cut off at parts intersecting the first and second semiconductor regions.

15. A solid-state imaging device, comprising:
a semiconductor substrate;
lattice-shaped pixel separating parts that divide the semiconductor substrate into a plurality of pixel regions arranged in a matrix form,
wherein each of the pixel regions includes:
a first semiconductor region disposed on a first surface in the semiconductor substrate;
a second semiconductor region disposed on the first surface in the semiconductor substrate separately from the first semiconductor region; and
a first blocking region disposed between the first semiconductor region and the second semiconductor region on the first surface in the semiconductor substrate and having a dielectric constant different from that of the semiconductor substrate,
a first read circuit connected to the first semiconductor region; and
a second read circuit connected to the second semiconductor region,
wherein the first blocking region has a conical shape or a truncated conical shape, and
wherein the first semiconductor region includes a third semiconductor region positioned at a part where corners of four pixel regions of the plurality of pixel regions meet, the second semiconductor region includes fourth semiconductor regions respectively positioned in two regions having a boundary formed by two adjacent pixel regions among the four pixel regions and interposed between the two regions, and the third semiconductor region is shared by the two pixel regions.

16. The solid-state imaging device according to claim 15, wherein the pixel separating parts are cut off at the part where the corners of the four pixel regions of the plurality of pixel regions meet.

17. The solid-state imaging device according to claim 15, wherein a height of the first blocking region from the first surface is greater than heights of the first and second semiconductor regions from the first surface.

18. The solid-state imaging device according to claim 15, wherein a cross section of the first blocking region parallel to the first surface has a circular shape or an elliptic shape.

19. A distance measurement device, comprising:
a light-emitting unit that projects light with a predetermined wavelength;
a solid-state imaging device that generates a pixel signal from received light; and
an arithmetic operation unit that calculates a distance to an object on a basis of the pixel signal generated by the solid-state imaging device,
wherein the solid-state imaging device includes:
a semiconductor substrate;
lattice-shaped pixel separating parts that divide the semiconductor substrate into a plurality of pixel regions arranged in a matrix form,
wherein each of the pixel regions includes:
a first semiconductor region disposed on a first surface in the semiconductor substrate;
a second semiconductor region disposed on the first surface in the semiconductor substrate separately from the first semiconductor region; and
a first blocking region disposed between the first semiconductor region and the second semiconductor region on the first surface in the semiconductor substrate and having a dielectric constant different from that of the semiconductor substrate,
a first read circuit connected to the first semiconductor region; and
a second read circuit connected to the second semiconductor region,
wherein the first blocking region has a conical shape or a truncated conical shape, and
wherein the first semiconductor region includes a third semiconductor region positioned at a boundary between the pixel regions of the plurality of pixel regions, the second semiconductor region includes two fourth semiconductor regions adjacent to the third semiconductor region having the boundary interposed between the third semiconductor region and the two fourth semiconductor regions, and the third semiconductor region is shared by two pixel regions of the plurality of pixel regions forming the boundary.

20. The distance measurement device according to claim 19, wherein a height of the first blocking region from the first surface is greater than heights of the first and second semiconductor regions from the first surface.

* * * * *